(12) United States Patent
Okuno et al.

(10) Patent No.: US 9,624,562 B2
(45) Date of Patent: Apr. 18, 2017

(54) AL ALLOY FILM FOR DISPLAY OR SEMICONDUCTOR DEVICE, DISPLAY OR SEMICONDUCTOR DEVICE HAVING AL ALLOY FILM, AND SPUTTERING TARGET

(75) Inventors: Hiroyuki Okuno, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 606 days.

(21) Appl. No.: 14/001,875

(22) PCT Filed: Feb. 27, 2012

(86) PCT No.: PCT/JP2012/054837
§ 371 (c)(1),
(2), (4) Date: Aug. 28, 2013

(87) PCT Pub. No.: WO2012/118039
PCT Pub. Date: Sep. 7, 2012

(65) Prior Publication Data
US 2014/0086791 A1    Mar. 27, 2014

(30) Foreign Application Priority Data
Feb. 28, 2011    (JP) .................................. 2011-042635

(51) Int. Cl.
*C22C 21/00* (2006.01)
*C22F 1/04* (2006.01)
(Continued)

(52) U.S. Cl.
CPC ................ *C22C 21/00* (2013.01); *C22F 1/04* (2013.01); *C23C 14/165* (2013.01);
(Continued)

(58) Field of Classification Search
CPC   C22C 21/00; H01L 21/2855; H01L 23/53219
See application file for complete search history.

(56) References Cited

U.S. PATENT DOCUMENTS

| 5,514,909 A | 5/1996 | Yamamoto et al. |
| 6,033,542 A | 3/2000 | Yamamoto et al. |

(Continued)

FOREIGN PATENT DOCUMENTS

| JP | 7-90552 | 4/1995 |
| JP | 2000-294556 | 10/2000 |

(Continued)

OTHER PUBLICATIONS

International Search Report issued Apr. 3, 2012, in PCT/JP2012/05483 Filed Feb. 27, 2012.
U.S. Appl. No. 13/990,981, filed May 31, 2013, Okuno, et al.

*Primary Examiner* — Roy King
*Assistant Examiner* — Janelle Morillo
(74) *Attorney, Agent, or Firm* — Oblon, McClelland, Maier & Neustadt, L.L.P.

(57) ABSTRACT

Provided is an Al alloy film for display devices, which has excellent heat resistance under high temperatures, low electric resistance (wiring resistance), and excellent corrosion resistance under alkaline environments. The present invention relates to an Al alloy film containing Ge (0.01-2.0 at. %) and a group X element (Ta, Ti, Zr, Hf, W, Cr, Nb, Mo, Ir, Pt, Re, and/or Os), wherein, with regard to precipitates each containing Al, the group X element and Ge generated when a heat treatment at 450 to 600° C. is carried out, the density of some of the precipitates which have equivalent circle diameters of 50 nm or more is controlled.

12 Claims, 5 Drawing Sheets

(51) Int. Cl.
　　　*H01L 21/285*　　　(2006.01)
　　　*H01L 23/532*　　　(2006.01)
　　　*H01L 27/12*　　　(2006.01)
　　　*C23C 14/18*　　　(2006.01)
　　　*C23C 14/34*　　　(2006.01)
　　　*C23C 14/16*　　　(2006.01)
　　　*H01L 21/28*　　　(2006.01)

(52) U.S. Cl.
　　　CPC ........ *C23C 14/185* (2013.01); *C23C 14/3414* (2013.01); *H01L 21/2855* (2013.01); *H01L 23/53219* (2013.01); *H01L 27/124* (2013.01); *H01L 21/28008* (2013.01); *H01L 2924/0002* (2013.01)

(56) References Cited

U.S. PATENT DOCUMENTS

| | | |
|---|---|---|
| 6,096,438 A | 8/2000 | Takagi et al. |
| 7,098,539 B2 | 8/2006 | Gotoh et al. |
| 7,154,180 B2 | 12/2006 | Gotoh et al. |
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 7,553,754 B2 | 6/2009 | Gotoh et al. |
| 7,622,809 B2 | 11/2009 | Gotoh et al. |
| 7,683,370 B2 | 3/2010 | Kugimiya et al. |
| 7,781,767 B2 | 8/2010 | Kawakami et al. |
| 7,803,238 B2 | 9/2010 | Kugimiya et al. |
| 7,943,933 B2 | 5/2011 | Hino et al. |
| 7,994,503 B2 | 8/2011 | Hino et al. |
| 8,044,399 B2 | 10/2011 | Hino et al. |
| 8,053,083 B2 | 11/2011 | Gotou et al. |
| 8,088,259 B2 | 1/2012 | Gotoh et al. |
| 8,163,143 B2 | 4/2012 | Takagi et al. |
| 8,299,614 B2 | 10/2012 | Kawakami et al. |
| 8,350,303 B2 | 1/2013 | Gotoh et al. |
| 8,384,280 B2 | 2/2013 | Ochi et al. |
| 8,422,207 B2 | 4/2013 | Nakai et al. |
| 8,482,189 B2 | 7/2013 | Goto et al. |
| 2003/0047812 A1 | 3/2003 | Hagihara et al. |
| 2006/0091792 A1 | 5/2006 | Kugimiya et al. |
| 2006/0181198 A1 | 8/2006 | Gotoh et al. |
| 2006/0275618 A1 | 12/2006 | Kugimiya et al. |
| 2008/0081532 A1 | 4/2008 | Okuno |
| 2008/0121522 A1 | 5/2008 | Ehira et al. |
| 2008/0223718 A1 | 9/2008 | Takagi et al. |
| 2009/0001373 A1 | 1/2009 | Ochi et al. |
| 2009/0011261 A1 | 1/2009 | Gotou |
| 2009/0133784 A1 | 5/2009 | Kugimiya et al. |
| 2009/0242394 A1 | 10/2009 | Takagi et al. |
| 2010/0032186 A1 | 2/2010 | Gotou et al. |
| 2010/0065847 A1 | 3/2010 | Gotou et al. |
| 2010/0207121 A1 | 8/2010 | Hino et al. |
| 2010/0328247 A1 | 12/2010 | Miki et al. |
| 2011/0008640 A1 | 1/2011 | Goto et al. |
| 2011/0121297 A1 | 5/2011 | Kawakami et al. |
| 2011/0147753 A1 | 6/2011 | Onishi et al. |
| 2011/0198602 A1 | 8/2011 | Nanbu et al. |
| 2011/0248272 A1 | 10/2011 | Ochi et al. |
| 2011/0318607 A1 | 12/2011 | Kobayashi et al. |
| 2012/0325655 A1* | 12/2012 | Iwasaki ............... C23C 14/3414 204/298.13 |

FOREIGN PATENT DOCUMENTS

| | | | |
|---|---|---|---|
| JP | 2002-322557 A | 11/2002 | |
| JP | 2010-238800 A | 10/2010 | |
| JP | 2011-17944 | 1/2011 | |
| JP | WO 2011105583 A1 * | 9/2011 | ............ C22C 21/00 |
| TW | 200830558 | 7/2008 | |

* cited by examiner

AL ALLOY FILM FOR DISPLAY OR SEMICONDUCTOR DEVICE, DISPLAY OR SEMICONDUCTOR DEVICE HAVING AL ALLOY FILM, AND SPUTTERING TARGET

TECHNICAL FIELD

The present invention relates to an Al alloy film for use in a display device such as a liquid crystal display and a semiconductor device such as IGBT, the Al alloy film being useful as an electrode and a wiring material which can be fabricated by both dry-etching and wet-etching processes, a display device and a semiconductor device comprising the Al alloy film, and a sputtering target used for the fabrication of the Al alloy film.

BACKGROUND ART

Aluminum alloy films for use in display devices are mainly used as electrodes and wiring materials. Examples of the electrodes and wiring materials include gate, source, and drain electrodes for a thin film transistor and a wiring material in a liquid crystal display (LDC); gate, source, and drain electrodes for a thin film transistor and a wiring material in an organic EL (GELD); cathode and gate electrodes and a wiring material in a field emission display (FED); an anode electrode and a wiring material in a vacuum fluorescent display (VFD); an address electrode and a wiring material in a plasma display panel (PDP); and a back electrode in an inorganic EL.

Aluminum alloy films for use in semiconductor device are mainly used as electrodes and wiring materials. Examples of the electrodes and wiring materials include emitter and collector electrodes and a wiring material for an insulated gate bipolar transistor (IGBT).

Hereinafter, while a liquid crystal display is representatively described as a liquid crystal display device, the present invention is not limited thereto.

Large-sized liquid crystal displays are widely used as main display devices because of advancement in low power consumption technology. A liquid crystal display having a size of more than 100 inches are now commercialized. There are various types of liquid crystal displays having different operating principles. Among them, active-matrix liquid crystal displays including thin film transistors (hereinafter, referred to as "TFTs") used for the switching of pixels are most-widely used because they have high-precision image qualities and can display fast moving images. In liquid crystal displays required to have lower power consumption and higher switching speeds of pixels, TFTs including semiconductor layers composed of polycrystalline silicon and continuous grain silicon are used.

For example, active-matrix liquid crystal displays include TFT substrates including TFTs serving as switching elements, pixel electrodes formed of conductive oxide films, and wiring, such as scan lines and signal lines. Scan lines and signal lines are electrically connected to pixel electrodes. Wiring materials constituting scan lines and signal lines are formed of Al-based alloy thin films.

The structure of a core portion of a TFT substrate including a semiconductor layer composed of hydrogenated amorphous silicon is described below with reference to FIG. 1.

As illustrated in FIG. 1, a scan line 25 is arranged on a glass substrate 21a. Part of the scan line 25 functions as a gate electrode 26 that controls the on/off state of a TFT. The gate electrode 26 is electrically insulated with a gate insulating film 27 (e.g., silicon nitride film). A semiconductor silicon layer 30 is arranged as a channel layer on the gate insulating film 27. Furthermore, a passivation film 31 (e.g., silicon nitride film) and so forth are arranged. The semiconductor silicon layer 30 is connected to a source electrode 28 and a drain electrode 29 with a low-resistance silicon layer 32 and has electrical conductivity.

The drain electrode 29 has a structure (called a "direct contact (DC)") in which the drain electrode is in direct contact with a transparent electrode 35 composed of indium tin oxide (ITO). As an electrode wiring material used for the direct contact, Al alloys described in patent literatures 1 to 5 are exemplified because Al has low electrical resistivity and excellent micro-fabrication property. These Al alloys are each directly connected to a transparent conductive oxide film constituting a transparent electrode or a semiconductor silicon layer without using a barrier metal layer composed of a refractory metal, such as Mo, Cr, Ti, and W.

These wiring films and electrodes 25 to 32 are covered with an insulating passivation film 33 composed of, for example, silicon nitride and supply electricity to the drain electrode 29 through the transparent electrode 35.

To ensure stable operating characteristics of the TFT illustrated in FIG. 1, in particular, it is necessary to increase the mobility of carriers (electrons and holes) in the semiconductor silicon layer 30. Thus, a production process of a liquid crystal display or the like includes a heat treatment step of heat treating a TFT, thereby resulting in microcrystallization or polycrystallization of the whole or part of the semiconductor silicon layer 30 having an amorphous structure. This increases the carrier mobility, improving the response speed of the TFT.

In the fabrication process of the TFT, for example, the deposition of the insulating passivation film 33 is performed at a relatively low temperature of about 250° C. to 350° C. To improve the stability of a TFT substrate (a liquid crystal display-driving portion in which TFTs are arranged in an array), high-temperature heat treatment at about 450° C. or higher is conducted in some cases. In the actual production of a TFT, a TFT substrate, and a liquid crystal display, such low- or high-temperature heat treatment is conducted twice or more in some cases.

However, in the case where the heat treatment temperature in a production process is a high temperature, such as about 450° C. or higher, and where such high-temperature heat treatment is conducted for extended periods of time, the heat treatment causes delamination of the thin layers illustrated in FIG. 1 and atomic interdiffusion between thin layers in contact with each other, thereby deteriorating the thin layers. Heat treatment has thus been conducted only at a temperature of at most 300° C. or lower. If anything, the fact is that research and development on wiring materials used for TFTs and structures of display devices has been intensively conducted even if the heat treatment temperature is minimized. This is because the entire production process of a TFT is considered to be ideally performed at room temperature from the technical point of view.

For example, in patent literature 1 described above, the entire or part of a dissolved element in an Al alloy film are precipitated in the form of metal compound by heat treatment conducted at 100° C. to 600° C. to obtain an Al alloy film having electrical resistivity of 10 μΩcm or less. However, experimental data disclosed in its embodiment are those heat-treated at 500° C. at the highest. Patent literature 1 fails to disclose heat resistance of an Al alloy film treated at temperatures higher than 500° C. Similarly, in an example of patent literature 2, results when an Al alloy film is heat-treated up to 500° C. are described, whereas no result when heat treatment is performed at a higher temperature is described. Patent literatures 3-5 describes evaluation results of heat resistance at 450° C. or lower. However, heat resistance when heat treatment is performed at a higher temperature is not evaluated at all. Needless to say, heat resistance when the film is repeatedly exposed to such a high temperature is not considered at all.

In the meantime, patent literature 6 discloses an Al alloy film having superior dry-etching fabrication property. However, results when an Al alloy film is heat-treated at 350° C., whereas no result when heat treatment is performed at 450° C. or higher temperatures is described.

CITATION LIST

Patent Literatures

Patent literature 1: Japanese Unexamined Patent Application Publication No. H7-90552
Patent literature 2: Japanese Unexamined Patent Application Publication No. 2003-73810
Patent literature 3: Japanese Unexamined Patent Application Publication No. 2002-322528
Patent literature 4: Japanese Unexamined Patent Application Publication No. H8-250494
Patent literature 5: Japanese Unexamined Patent Application Publication No. 2001-93862
Patent literature 6: Japanese Unexamined Patent Application Publication No. 2000-294556

SUMMARY OF INVENTION

Technical Problem to be Solved

Recently, it has been desirable to provide an Al alloy film having excellent heat resistance even when heat treatment is performed at high temperatures. This is because there is an increasing need to enhance carrier mobility, which significantly affects the performance of a TFT, in a semiconductor silicon layer to achieve energy savings and higher performance (for example, corresponding to fast moving images) of a liquid crystal display. To that end, it is necessary to crystallize amorphous hydrogenated silicon serving as a constituent material of the semiconductor silicon layer. Electron mobility in silicon is about three times the hole mobility. Continuous grain silicon has an electron mobility of about 300 $cm^2/V \cdot s$, polycrystalline silicon has an electron mobility of about 100 $cm^2/V \cdot s$, and amorphous hydrogenated silicon has an electron mobility of about 1 $cm^2/V \cdot s$ or less. In the case where amorphous hydrogenated silicon is deposited and then subjected to heat treatment, the amorphous hydrogenated silicon becomes microcrystalline to improve carrier mobility. With respect to the heat treatment, a higher heating temperature and a longer heating time allow the microcrystallization of amorphous hydrogenated silicon to proceed, thereby improving the carrier mobility. However, a higher temperature of the heat treatment causes a problem of the formation of an abnormal protrusion (hillock) on an Al alloy wiring thin film due to thermal stress. Hitherto, the upper limit of the temperature of the heat treatment when the Al alloy thin film is used has thus been at most about 350° C. Hence, when heat treatment is performed at a higher temperature than the temperature, a thin film composed of a refractory metal, such as Mo, is commonly used. However, the thin film has a problem in which it is not compatible to an increase in the size of a display because of its high wiring resistance.

In addition to the above-mentioned high-temperature heat resistance, an Al alloy film for use in a display or semiconductor device is required to have various properties. An increase in the amount of an alloying element contained in the Al alloy film increases the electrical resistivity of the wiring. The Al alloy film is thus required to have a sufficiently low electrical resistivity even if heat treatment is performed at a high temperature, such as about 450° C. to about 600° C.

The Al alloy film for use in a display device is also required to have a low contact resistance (contact resistivity) when it is directly connected to a transparent pixel electrode.

Furthermore, the Al alloy film is required to have excellent corrosion resistance as well. In particular, in a production process of a TFT substrate, a plurality of wet processes are performed. The addition of a more electropositive metal than Al causes a problem of galvanic corrosion, thereby degrading the corrosion resistance. For example, an alkaline developer containing tetramethylammonium hydroxide (TMAH) is used in a photolithography step. In the case of a direct contact structure, a barrier metal layer is omitted, so that the Al alloy film is exposed and easily damaged by the developer. Thus, the Al alloy film is required to have excellent alkaline corrosion resistance, such as resistance to the alkaline developer.

In a wet cleaning step of stripping a photoresist (photosensitive resin) formed in the photolithography step, wet cleaning is continuously performed with an organic stripping solution containing amine. However, the mixing of amine and water forms an alkaline solution. This causes another problem in which Al is corroded in a short time. Meanwhile, the Al alloy is subjected to heat treatment in a chemical vapor deposition (CVD) step before the wet cleaning step. An alloy component forms a precipitate in an Al matrix during the heat treatment. There is a large potential difference between the precipitate and aluminum. The instant the amine in the stripping solution dips into water, alkaline corrosion proceeds by the galvanic corrosion. Aluminum, which is electrochemically negative, is ionized to migrate, thereby disadvantageously causing pitting corrosion (it looks like black spots). Thus, the Al alloy film is preferably required to have excellent resistance to the stripping solution used to strip the photosensitive resin.

Two types of etching processes are generally used in fabrication of wiring; one is wet-etching (a method of patterning wiring by chemical etching), and the other is dry-etching (a method of patterning wiring by reactive-ion etching). The Al alloy film is required to have excellent fabrication property for both of the etching method.

The present invention has been made in light of the circumstances described above. It is an object of the present invention to provide an Al alloy film for use in a display and a semiconductor device, the Al alloy film having excellent high-temperature heat resistance such that a hillock is not formed even when the Al alloy film is exposed to a high temperature of about 450° C. to about 600° C., and having low electrical resistance (wiring resistance), excellent resistance to alkaline corrosion, such as resistance to an organic alkaline developer, and excellent fabrication property for both wet-etching and dry-etching. It is another object of the present invention to provide an Al alloy film for use in a display and a semiconductor device, in which the Al alloy film preferably has excellent resistance to a stripping solution used for a photosensitive resin (stripping solution resistance) and low contact resistance when it is in direct contact (direct contact) with a transparent pixel electrode (transparent conductive film) and can be directly connected to the transparent conductive film.

Solution to Problem

The present invention provides an Al alloy film for use in a display and semiconductor device, a sputtering target, an Al alloy wiring, a display and semiconductor device having the Al alloy film described below.

[1] An Al alloy film for use in a display and a semiconductor device comprising;

Ge of 0.01 to 2.0 at %; and at least one element selected from group X consisting of Ta, Ti, Zr, Hf, W, Cr, Nb, Mo, Ir, Pt, Re, and Os;

in which when the Al alloy film is subjected to heat treatment at 450° C. to 600° C., the Al alloy film satisfies requirement (1) described below, (1) first precipitates each containing Al, at least one element selected from group X, and Ge and each having an equivalent circle diameter of 50 nm or more are present at a density of 200,000 particles/mm$^2$ or more.

[2] The Al alloy film for use in a display and a semiconductor device described in [1] in which when the Al alloy film is subjected to heat treatment at 450° C. to 600° C., the Al alloy film further satisfies requirement (2) described below, (2) second precipitates each containing Al and at least two elements selected from the group X and each having an equivalent circle diameter of 50 nm or more are present at a density of 100,000 particles/mm$^2$ or more.

[3] The Al alloy film for use in a display and a semiconductor device described in [1] or [2] further includes at least one element from a group consisting of rare-earth elements, in which when the Al alloy film is subjected to heat treatment at 450° C. to 600° C., the Al alloy film further satisfies requirement (3) described below, (3) third precipitates each containing Al, at least one element selected from the group X, and at least one of the rare-earth element and each having an equivalent circle diameter of 10 nm or more are present at a density of 1,000,000 particles/mm$^2$ or more.

[4] In the Al alloy film for use in a display and a semiconductor device described in [3], further satisfies requirement (4) described below, (4) fourth precipitates each containing Al, Ge, at least one element selected from the group X, and at least one of the rare-earth element and each having an equivalent circle diameter of 10 nm or more are present at a density of 1,000,000 particles/mm$^2$ or more.

[5] In the Al alloy film for use in a display and a semiconductor device described in any one of [1] to [4] further includes at least one element selected from a group consisting of Ni, Co, Fe, in which when the Al alloy film is subjected to heat treatment at 450° C. to 600° C., the Al alloy film further satisfies requirement (5) described below, (5) fifth precipitates each containing Al, Ge, at least one element selected from a group consisting of Ni, Co, Fe, and one element selected from the group X, and each having an equivalent circle diameter of 250 nm or more are present at a density of 2,000 particles/mm$^2$ or more.

[6] In the Al alloy film for use in a display or semiconductor device described in [1], each of the first precipitates has an equivalent circle diameter of 1 μm or less.

[7] In the Al alloy film for use in a display or semiconductor device described in [2], each of the second precipitates has an equivalent circle diameter of 1 μm or less.

[8] In the Al alloy film for use in a display or semiconductor device described in [3], each of the third precipitates has an equivalent circle diameter of 1 μm or less.

[9] In the Al alloy film for use in a display or semiconductor device described in [4], each of the fourth precipitates has an equivalent circle diameter of 1 μm or less.

[10] In the Al alloy film for use in a display or semiconductor device described in [5], each of the fifth precipitates has an equivalent circle diameter of 3 μm or less.

[11] In the Al alloy film for use in a display or semiconductor device described in any one of [1] to [10], the contained amount of the element in the group X is in the range of 0.1 to 5 atomic percent.

[12] In the Al alloy film for use in a display or semiconductor device described in any one of [3] to [11], the contained amount of the rare-earth element is in the range of 0.1 to 0.45 atomic percent.

[13] In the Al alloy film for use in a display or semiconductor device described in any one of [5] to [12], the contained amount of at least one element selected from the group consisting of Ni, Co, Fe is in the range of 0.1 to 0.35 atomic percent.

[14] In the Al alloy film for use in a display or semiconductor device described in any one of [1] to [13], the temperature of the heat treatment is 500° C. to 600° C.

[15] In the Al alloy film for use in a display or semiconductor device described in any one of [1] to [14], the heat treatment is performed at least twice.

[16] In the Al alloy film for use in a display or semiconductor device described in [5], the Al alloy film is directly connected to a transparent conductive film.

[17] In the Al alloy film for use in a display or semiconductor device described in any one of [1] to [15], the Al alloy film is connected to a transparent conductive film with a film containing at least one element selected from a group consisting of Mo, Ti, W, and Cr.

[18] A sputtering target contains 0.01 to 2.0 atomic percent of Ge, 0.1 to 5 atomic percent of at least one element selected from group X consisting of Ta, Ti, Zr, Hf, W, Cr, Nb, Mo, Ir, Pt, Re, and Os.

[19] A sputtering target described in [18] further contains 0.1 to 0.45 atomic percent of one rare-earth element.

[20] A sputtering target described in [18] or [19] further contains 0.1 to 0.35 atomic percent of at least one element selected from a group consisting of Ni, Co, and Fe.

[21] A sputtering target described in any one of [18] to [20] in which the balance being Al and incidental impurities.

[22] In the Al alloy film for use in a display or semiconductor device described in any one of [1] to [17], the Al alloy film is dry-etched with a halogen gas or a gas consisting halogen-containing compound.

[23] In the Al alloy film for use in a display or semiconductor device described in any one of [1] to [17], the Al alloy film is wet-etched with an acid solution of pH 3 or less.

[24] A display device includes the Al alloy film for use in a display device described in any one of [1] to [17].

[25] A liquid crystal display includes the Al alloy film for use in a display device described in any one of [1] to [17].

[26] An organic electroluminescent (EL) display includes the Al alloy film for use in a display device described in any one of [1] to [17].

[27] A field emission display includes the Al alloy film for use in a display device described in any one of [1] to [17].

[28] A vacuum fluorescent display includes the Al alloy film for use in a display device described in any one of [1] to [17].

[29] A plasma display includes the Al alloy film for use in a display device described in any one of [1] to [17].

[30] An inorganic electroluminescent (EL) display includes the Al alloy film for use in a display device described in any one of [1] to [17].

[31] A semiconductor apparatus includes the Al alloy film for use in a semiconductor device described in any one of [1] to [17].

[32] A semiconductor device includes the Al alloy film for use in a semiconductor device described in any one of [1] to [17].

[33] An electrode of a semiconductor device includes the Al alloy film for use in a semiconductor device described in any one of [1] to [17].

[34] A wiring of a semiconductor device includes the Al alloy film for use in a semiconductor device described in any one of [1] to [17].

Advantageous Effects of Invention

A first Al alloy film (Al—Ge-group X element alloy) according to the present invention is composed of predetermined alloy elements and a first precipitate (preferably a first precipitate and a second precipitate). Thus, the first Al alloy film has excellent heat resistance when exposed to a high temperature of about 450° C. to about 600° C., has satisfactory low electrical resistance (wiring resistance) after high-temperature treatment, and also has resistance to alkaline corrosion, etching fabrication property, and resistance to stripping solution.

A second Al alloy film (Al—Ge-group X element-rare-earth element alloy) according to the present invention is a preferred embodiment and is composed of predetermined alloy elements, a first precipitate (preferably a first precipitate and a second precipitate), and a third precipitate (preferably a third precipitate and a fourth precipitate). Thus, the second Al alloy film has higher heat resistance and higher resistance to alkaline corrosion. More preferably, a third Al alloy film (Al—Ge-group X element-rare-earth element-Ni/Co/Fe alloy) according to the present invention is composed of predetermined alloy elements, the first precipitate (preferably a first precipitate, a second precipitate, and a third precipitate, and more preferably a first precipitate, a second precipitate, a third precipitate, and a fourth precipitate), and a fifth precipitate. Thus, low contact resistivity with a transparent conductive film can be provided in addition to the foregoing properties. It is therefore possible to directly connect the Al alloy film to the transparent conductive film.

According to the present invention, in particular, in a process for producing a thin-film transistor substrate including semiconductor layers composed of polycrystalline silicon and continuous grain silicon, when the substrate is exposed to a harsh high-temperature environment in which high-temperature heat treatment at about 450° C. to about 600° C. is performed and even when the high-temperature heat treatment is performed at least twice, carrier mobility in the semiconductor silicon layers are increased, thereby improving the response speed of a TFT. It is thus possible to provide a high-performance display device that can achieve power savings and support high-speed moving images. The present invention also provides applicability both dry-etching and wet-etching processes to wiring fabrication in producing a thin-film transistor substrate.

According to the present invention, in a process for producing a semiconductor device such as IGBT having an electrode/wiring comprising the Al alloy film superior in heat resistance (particularly high-temperature heat resistance), high-temperature heat treatment can be performed to activate carriers in a collector layer. It is thus possible to provide an improved semiconductor device having the Al alloy film and an improved semiconductor apparatus having the semiconductor device. The present invention also provides applicability both dry-etching and wet-etching processes to wiring fabrication in producing a semiconductor device.

DESCRIPTION OF EMBODIMENTS

Figure 1:
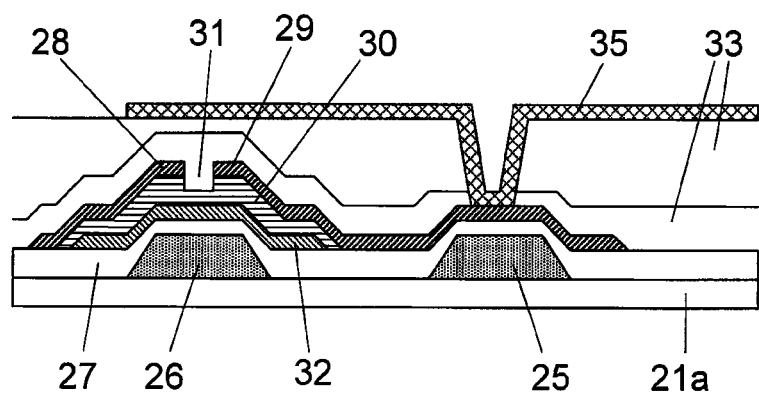
FIG. 1 illustrates a cross-sectional structure of a core portion of a thin film transistor.

The inventors have conducted intensive studies in order to provide an Al alloy film (also referred to as a first Al alloy film) for use in a display device, the Al alloy film having excellent high-temperature heat resistance such that a hillock is not formed even when the film is repeatedly exposed to a high temperature of about 450° C. to 600° C., having excellent dry-etching and wet-etching properties (hereinafter refereed to as etching property), having low electrical resistance (wiring resistance), and high resistance to alkaline corrosion; preferably, to provide an Al alloy film (also referred to as a second Al alloy film) for a display device, the Al alloy film having higher high-temperature heat resistance; and more preferably, to provide an Al alloy film (also referred to as a third Al alloy film) for a display device, the Al alloy film also having excellent resistance to stripping solution at a high temperature and being capable of establishing direct contact (direct contact) with a transparent conductive film because a low contact resistance between the Al alloy film and the transparent conductive film is obtained when the Al alloy film is directly connected to the transparent conductive film.

It was found that a first Al alloy film (Al—Ge-group X-REM alloy film) which contains Ge of 0.01 to 2.0 at %; at least one element selected from the group (group X) consisting of Ta, Ti, Zr, Hf, W, Cr, Nb, Mo, Ir, Pt, Re, and Os; and which satisfies requirement (1) described below when heat treatment is performed at 450° C. to 600° C., solves the foregoing issues (high heat resistance to high-temperature treatment, etching property, low electrical resistance, and high resistance to an organic alkaline developer).

(1) first precipitates each containing Al, Ge, at least one element selected from group X described above, each having an equivalent circle diameter of 50 nm or more are present at a density of 200,000 particles/mm² or more.

Furthermore, it was found that the first Al alloy film which satisfies above-described requirement (1) and further satisfies requirement (2) described below when heat treatment is performed at 450° C. to 600° C., shows higher heat resistance.

(2) second precipitates each containing Al and at least two elements selected from group X described above, and each having an equivalent circle diameter of 50 nm or more are present at a density of 100,000 particles/mm² or more.

Furthermore, it was found that a second Al alloy film which satisfies requirement (1) and preferably further satisfies requirement (2) described above, and further satisfies requirement (3) described below when heat treatment is performed at 450° C. to 600° C., shows higher heat resistance as compared to the first Al alloy film.

(3) third precipitates each containing Al, at least one element selected from group X described above, and at least one rare-earth element described above, and each having an equivalent circle diameter of 10 nm or more are present at a density of 1,000,000 particles/mm² or more.

Moreover, it was found that a second Al alloy film which satisfies the requirement (1) (and preferably further satisfies the requirement (2)) and the requirement (3) described above, and further satisfies requirement (4) described below when heat treatment is performed at 450° C. to 600° C., shows even higher heat resistance.

(4) fourth precipitates each containing Al, Ge, at least one element selected from group X described above, and at least one rare-earth element described above, and each having an equivalent circle diameter of 10 nm or more are present at a density of 1,000,000 particles/mm² or more.

Furthermore, it was found that a third Al alloy film (Al-group X element-REM-[Ni,Co,Fe] alloy film) which further contains at least one element selected from group Ni, Co, Fe, and which satisfies requirement (1) and preferably further satisfies at least one of the requirements (2), (3), and (4) described above, and requirement (5) described below when heat treatment is performed at 450° C. to 600° C., has low contact resistivity with a transparent conductive film such as ITO and high resistance to a stripping solution during high-temperature heat treatment.

(5) fifth precipitates each containing Al, Ge, at least one element selected from Ni, Co, Fe, and at least one element selected from group X described above and each having an equivalent circle diameter of 250 nm or more are present at a density of 2,000 particles/mm² or more.

The first Al alloy film contains Ge, a group X element (an element that improves high-temperature heat resistance), which is a refractory metal in an Al alloy and the first precipitates (Al—Ge—X). In case the first Al alloy film contains Ge and two or more group X elements, the first Al alloy film contains the first precipitates (such as Al—Ge—X1, Al—Ge—X2; X1 and X2 represents an element different from each other), and the second precipitates (such as Al—X1-X2, Al—X1-X3, Al—X1-X2-X3 in case the Al alloy film has three kinds of group X elements). Hence, the first Al alloy film has high heat resistance at high temperatures (high-temperature heat resistance), high resistance to alkaline corrosion, high resistance to a stripping solution, excellent electrical resistance (wiring resistance), and superior etching property, and thus is suitably used as a material for wiring, such as scan lines and signal lines, and electrodes, such as gate electrodes, source electrodes, and drain electrodes for a display device. In particular, the first Al alloy film is suitably used as a gate electrode and a material for a relevant wiring film in a thin film transistor substrate that is susceptible to high-temperature heat treatment. The first Al alloy film is also suitably used as a electrode for power semiconductor such as an emitter electrode for IGBT.

The second Al alloy film contains Ge, the group X element (an element that improves high-temperature heat resistance), which is a refractory metal in an Al alloy, and the rare-earth element. In case the second Al alloy film contains one kind of group X element, the film contains the first precipitates (Al—Ge—X), the third precipitates (Al—Ge—REM where REM represents a rare earth element), and/or the fourth precipitates (Al—Ge—X-REM). In case the second Al alloy film contains Ge and two or more group X elements, the film further contains the second precipitates (such as Al—X1-X2). The film may contain the first, third, and fourth precipitates comprising multiple combinations of elements according to the number of the group X elements in the film. Hence, the second Al alloy film has particularly higher heat resistance at high temperatures (high-temperature heat resistance) among the excellent properties possessed by the first Al alloy film, and thus is suitably used as a material for wiring, such as scan lines and signal lines, and electrodes, such as gate electrodes, source electrodes, and drain electrodes. In particular, the second Al alloy film is suitably used as a gate electrode and a material for a relevant wiring film in a thin film transistor substrate that is susceptible to high-temperature heat treatment. The second Al alloy film is also suitably used as a electrode for power semiconductor such as an emitter electrode for IGBT.

The third Al alloy film contains the group X element, Ge, preferably the rare-earth element, and at least one element selected from the group consisting of Ni, Co, Fe (an element that improves contact resistance with a transparent conductive film), and precipitates in the first and the second Al alloy films described above, and the predetermined third precipitates (Al—X—Ge—[Ni,Co,Fe]). Hence, the third Al alloy film, having the properties of the first and the second Al alloy films, is suitably used as a material for an electrode and wiring that can come into direct contact with a transparent conductive film without using a barrier metal layer.

In this specification, high-temperature heat resistance indicates that a hillock is not formed when the Al alloy film is exposed to a high temperature of at least about 450° C. to about 600° C., and preferably indicates that a hillock is not formed even when the Al alloy film is repeatedly exposed to the foregoing high temperature at least twice.

In the present invention, the Al alloy film has properties, such as superior etching properties and high resistance (corrosion resistance) to chemical solutions (an organic alkaline developer and a stripping solution) used in a production process of a display device and a semiconductor device, low contact resistance with a transparent conductive film, and low electrical resistance in addition to high-temperature heat resistance. The Al alloy film is characterized in that these properties are provided not only in the low-temperature range of less than 450° C. but also in the foregoing high-temperature range. Note that in a process for fabricating a TFT, the Al alloy film is exposed to an alkaline environment at a stage before the film is subjected to heat treatment. In examples described below, the Al alloy film before heating was examined for resistance to an organic alkaline developer. According to the present invention, experimental results demonstrate that the Al alloy film after high-temperature heat treatment also has satisfactory resistance to the alkaline developer. Incidentally, resistance to the alkaline developer (alkaline developer resistance) is broadly referred to as resistance to alkaline corrosion, in some cases.

The Al alloy film used in the present invention is described in detail below.

(First Al Alloy Film)

The first Al alloy film is an Al—Ge-group X element alloy film that contains Ge and at least one element selected from group X consisting of Ta, Ti, Zr, Hf, W, Cr, Nb, Mo, Ir, Pt, Re, and Os.

Here, the elements in group X described above are refractory metals each having a melting point of about 1600° C. or higher and each contribute to improvement in heat resistance at high temperatures. These elements may be added alone or in combination of two or more. Among group X elements, Ta, Ti, Zr, and Hf are preferred. Ta, Zr, and Hf are more preferred.

The proportion of the group X element (when one of the elements is added, the proportion is based on the amount of the element contained; and when two or more of the elements are added, the proportion is based on the total amount of the elements) is preferably in the range of 0.1 to 5 atomic percent. A proportion of the group X element of less than 0.1 atomic percent may not effectively result in the foregoing effects. A proportion of the group X element exceeding 5 atomic percent may result in an excessive increase in the electrical resistance of the Al alloy film itself and may cause a problem in which, for example, residues are easily formed during a wiring process. The proportion of the group X element is more preferably in the range of 0.1 atomic percent to 3.0 atomic percent and still more preferably 0.3 atomic percent to 2.0 atomic percent.

Ge is an element that contributes to improvement in high-temperature heat resistance and that prevents the formation of a hillock in a high-temperature process. The first Al alloy film may contain at least group X element and Ge, and other additional elements as long as the additional elements do not inhibit the effects of group X element and Ge.

To effectively provide the effect of Ge, the proportion of Ge is preferably in the range of 0.01 to 2.0 atomic percent. A proportion of Ge of less than 0.01 atomic percent may not effectively provide the effect and high enough density of the first precipitates which contribute to improvement of heat resistance of the Al alloy film. A proportion of Ge exceeding 2.0 atomic percent may result in an excessive increase in the electrical resistance of the Al alloy film. The proportion of Ge is more preferably in the range of 0.1 atomic percent to 1.0 atomic percent and still more preferably 0.2 atomic percent to 0.6 atomic percent.

Furthermore, the first Al alloy film indispensably contains the first precipitates having the predetermined size and the predetermined density specified in requirement (1) described above by high-temperature heat treatment at 450° C. to 600° C., and preferably contains the second precipitates having the predetermined size and the predetermined density specified in requirement (2), thereby improving high-temperature heat resistance and high resistance to a stripping solution in a high-temperature process. The first precipitates may contain Ge and at least one element selected from the group X. Another element may be contained as long as it does not inhibit the effect of the first precipitates. The second precipitates may contain at least two elements selected from the group X. Another element may be contained as long as it does not inhibit the effect of the second precipitates.

The first Al alloy film described above is an Al alloy film containing the foregoing elements and the balance being Al and incidental impurities.

Here, examples of the incidental impurities include Si and B. The total amount of the incidental impurities is not particularly limited and may be contained in an amount of about 0.5 atomic percent or less. With respect to each of the incidental impurities, B may be contained in an amount of 0.012 atomic percent or less. Si may be contained in an amount of 0.12 atomic percent or less.

The first and second precipitates each have an equivalent circle diameter (size) of 50 nm or more. The results of studies by the present inventors demonstrated that precipitates each having an equivalent circle diameter of less than 50 nm do not provide the intended effect even if the first and second precipitates each have Al—Ge-group X element and Al—X1-X2 compositions, respectively. To effectively provide the effect of improving the high-temperature heat resistance, the lower limit of the equivalent circle diameter may be 50 nm. The upper limit of the equivalent circle diameter is not particularly limited in relation to the foregoing effect. In the case where the size of the precipitates is increased to form coarse precipitates, the precipitates may be visually observed by inspection with an optical microscope, and result in poor appearance. The upper limit of the equivalent circle diameter is thus preferably 1 µm. Each of the first and second precipitates preferably has an equivalent circle diameter of 50 nm to 800 nm.

Further, in the present invention, the first precipitates each having an equivalent circle diameter of 50 nm or more need to be present at a density of 200,000 particles/mm$^2$ or more. The results of studies by the present inventors demonstrated that in the case where the first precipitates are present at a density of less than 200,000 particles/mm$^2$, the intended effect is not provided even if the first precipitates each have a size of 50 nm or more. To effectively provide the effect of improving the high-temperature heat resistance, the precipitates are preferably present at a higher density. The first precipitates are preferably present at a density of 2,000,000 particles/mm$^2$ or more.

Furthermore, in the present invention, the second precipitates each having an equivalent circle diameter of 50 nm or more need to be present at a density of 100,000 particles/mm$^2$ or more. The results of studies by the present inventors demonstrated that in the case where the second precipitates are present at a density of less than 100,000 particles/mm$^2$, the intended effect is not provided even if the second precipitates each have a size of 50 nm or more. To effectively provide the effect of improving the high-temperature heat resistance, the precipitates are preferably present at a higher density. The second precipitates are preferably present at a density of 1,000,000 particles/mm$^2$ or more.

(Second Al Alloy Film)

The second Al alloy film is an Al—Ge-group X element-REM alloy film that contains the rare-earth element (REM) in addition to Ge and the group X element described above.

Here, the rare-earth element (REM) added in combination with Ge and the group X element in the Al alloy film contributes to improvement in high-temperature heat resistance. Moreover, REM itself has the effect of improving the corrosion resistance in a alkaline solution, which Ge or group X element does not have.

Here, the rare-earth element indicates an element group including Sc (scandium) and Y (yttrium) in addition to lanthanoid elements (a total of 15 elements from La with an atomic number of 57 to Lu with an atomic number of 71 in the periodic table). In the present invention, the rare-earth elements may be used alone or in combination of two or more. Among the rare-earth elements, Nd, La, Gd, and Ce are preferred. Nd and La are more preferred.

To effectively provide the effect of rare-earth element, the proportion of the rare-earth element (when one of the elements is added, the proportion is based on the amount of the element contained; and when two or more of the elements are added, the proportion is based on the total amount of the elements) is preferably in the range of 0.1 to 0.45 atomic percent. A proportion of the rare-earth element of less than 0.1 atomic percent may not effectively provide the heat resistance and the resistance to alkaline corrosion. A proportion of the rare-earth element exceeding 0.45 atomic percent may result in low etching rate of the Al alloy film itself and may cause a problem in which residues are easily formed during a wiring process. The proportion of the rare-earth element is more preferably in the range of 0.15 atomic percent to 0.4 atomic percent and still more preferably 0.15 atomic percent to 0.3 atomic percent.

The second Al alloy film may contain at least the group X element, Ge, and rare-earth element. Another element may be contained as long as it does not inhibit the effect of foregoing elements.

An example of the second Al alloy film is an Al alloy film containing the foregoing elements and the balance being Al and incidental impurities.

Here, examples of the incidental impurities include Si and B. The total amount of the incidental impurities is not particularly limited and may be contained in an amount of about 0.5 atomic percent or less. With respect to each of the incidental impurities, B may be contained in an amount of 0.012 atomic percent or less. Si may be contained in an amount of 0.12 atomic percent or less.

Furthermore, the second Al alloy film contains the first precipitates (and preferably the second precipitates) and the third precipitates (and preferably the fourth precipitates) having the predetermined size and the predetermined density specified in requirements (1) to (4) described above by high-temperature heat treatment at 450° C. to 600° C., thereby improving high-temperature heat resistance and preventing the formation of a hillock in a high-temperature process. The third precipitates may contain at least the group X element and the REM. The fourth precipitates may contain at least the group X element, Ge, and the REM. Another element may be contained as long as it does not inhibit the effect of the precipitates.

The third and fourth precipitates each have an equivalent circle diameter (size) of 10 nm or more. According to studies by the present inventors, the precipitates each having an equivalent circle diameter of less than 10 nm do not provide the intended effect even if the precipitates each have an Al-group X element-REM composition (the third precipitates) or an Al—Ge-group X element-REM composition (the fourth precipitates). To effectively provide the effect of improving the heat resistance at high temperature, the lower limit of the equivalent circle diameter may be 10 nm. The upper limit of the equivalent circle diameter is not particularly limited in relation to the foregoing effect. In the case where the size of the precipitates is increased to form coarse precipitates, the precipitates may be visually observed by inspection with an optical microscope, resulting in poor appearance. Thus, the upper limit of the equivalent circle diameter is preferably 1 µm. Each of the first precipitates preferably has an equivalent circle diameter of 10 nm to 800 nm.

Furthermore, in the present invention, the precipitates each having an equivalent circle diameter of 10 nm or more need to be present at a density of 1,000,000 particles/mm$^2$ or more. According to results of studies by the present inventors, in the case where the third and fourth precipitates are present at a density of less than 1,000,000 particles/mm$^2$, the intended effect is not provided even if the third and fourth precipitates each have a size of 10 nm or more. To effectively provide the effect of improving the high-temperature heat resistance, the precipitates are preferably present at a higher density. The precipitates are preferably present at a density of 3,000,000 particles/mm$^2$ or more.

(Third Al Alloy Film)

The third Al alloy film is an Al—Ge-group X element-REM-[Ni,Co,Fe] alloy film that contains at least one element from a group consisting of Ni, Co, and Fe, in addition to the above described Ge, the group X element, and the rare-earth element (REM).

Here, Ni, Co, and Fe are elements that enable the Al alloy film to come into direct contact with a transparent conductive film. This is because electrical continuity between the Al alloy film and the transparent conductive film can be established with highly conductive Al-based precipitates, containing at least one element from a group consisting of Ni, Co, and Fe ([Ni,Co,Fe]), formed by heat treatment in a process for fabricating a TFT. They may be added separately. Alternatively, two or all of them may be added.

To effectively provide the effect, the proportion of [Ni, Co,Fe] (when one of the elements is added, the proportion is based on the amount of the element contained; and when two or all of the elements are added, the proportion is based on the total amount of the elements) is preferably in the range of 0.1 to 0.35 atomic percent. A proportion of [Ni, Co,Fe] of less than 0.1 atomic percent may not provide the intended effect and may not ensure the density of the fifth precipitates that contribute to a reduction in the contact resistance with the transparent conductive film. That is, the size of the fifth precipitates is small, and the density is low. It is thus difficult to stably maintain low contact resistance with the transparent conductive film. A proportion of [Ni, Co,Fe] exceeding 0.35 atomic percent may result in low etching rate of the Al alloy film itself and may cause a problem in which residues are easily formed during a wiring process. The proportion of [Ni,Co,Fe] is more preferably in the range of 0.1 atomic percent to 0.25 atomic percent and still more preferably 0.1 atomic percent to 0.2 atomic percent.

The third Al alloy film may contain Ge, at least one element selected from group X (and at least one element selected from a group consisting of Ni, Co, and Fe. alloy film that contains at least one element from a group consisting of Ni, Co, and Fe. Another element may be contained as long as it does not inhibit the effect of the precipitates.

The third Al alloy film described above contains the foregoing elements and the balance being Al and incidental impurities.

Here, examples of the incidental impurities include Si, and B. The total amount of the incidental impurities is not particularly limited and may be contained in an amount of about 0.5 atomic percent or less. With respect to each of the incidental impurities, B may be contained in an amount of 0.012 atomic percent or less. Si may be contained in an amount of 0.12 atomic percent or less.

Furthermore, the third Al alloy film contains the fifth precipitates (Al—Ge-group X element-[Ni,Co,Fe]-containing precipitates) having the predetermined size and the predetermined density specified in requirement (5) described above by high-temperature heat treatment at 450° C. to 600° C., thereby achieving high resistance to a stripping solution at high temperatures and low contact resistance with the transparent conductive film. The fifth precipitates may contain at least Ge, the group X element, and at least one element selected from a group consisting of Ni, Co, and Fe. Another element may be contained as long as it does not inhibit the effect of the precipitates.

The fifth precipitates each have an equivalent circle diameter (size) of 250 nm or more. According to studies by the present inventors, precipitates each having an equivalent circle diameter of less than 250 nm do not provide the intended effect even if the precipitates each satisfy the foregoing composition. To effectively provide the foregoing effect, the lower limit of the equivalent circle diameter may be 250 nm. The upper limit of the equivalent circle diameter is not particularly limited in relation to the foregoing effect. In the case where the size of the precipitates is increased to form coarse precipitates, the precipitates can be visually observed by inspection with an optical microscope, resulting in poor appearance. Thus, the upper limit of the equivalent circle diameter is preferably 3 μm. Each of the fifth precipitates preferably has an equivalent circle diameter of 250 nm to 2 μm.

Furthermore, in the present invention, the precipitates each having an equivalent circle diameter of 250 nm or more need to be present at a density of 2,000 particles/mm$^2$ or more. The results of studies by the inventors demonstrated that in the case where the fifth precipitates are present at a density of less than 2,000 particles/mm$^2$, the intended effect is not provided even if the third precipitates each have a size of 250 nm or more. To effectively provide both of the effect of improving the resistance to a stripping solution and the effect of reducing the contact resistance with the transparent conductive film, the precipitates are preferably present at a higher density. The precipitates are preferably present at a density of 5,000 particles/mm$^2$ or more.

In the first to fifth precipitates, precipitates "containing" or "including" the predetermined elements mean those which have the predetermined elements and the balance being Al and incidental impurities. "Incidental impurities" are elements other than the predetermined of each precipitates.

The Al alloy film according to the present invention has been described above.

In the present invention, heat treatment to form the first to fifth precipitates described above is in the range of 450° C. to 600° C. and preferably 500° C. to 600° C. The heat treatment is preferably performed in vacuum or in a nitrogen and/or inert gas atmosphere. The treatment time is preferably in the range of 1 minute to 60 minutes. According to the present invention, it was found that even if the foregoing heat treatment (high-temperature heat treatment) is performed two or more, a hillock and so forth are not formed.

Examples of a TFT production process corresponding to the high-temperature heat treatment include annealing by, for example, a laser for crystallization of amorphous silicon; the formation of a film by chemical vapor deposition (CVD) used for the formation of various thin films; and the temperature of a heat treatment furnace during impurity diffusion and heat curing of a protective film. In particular, the Al alloy film is often exposed to the foregoing high temperature when subjected to heat treatment for crystallization and impurity diffusion of amorphous silicon.

In particular, to ensure high-temperature heat resistance, etching property, and a reduction in wiring resistance, the Al alloy film preferably has a thickness of 50 nm or more and more preferably 100 nm or more. The upper limit of the thickness is not particularly limited from the point of view described above. In view of the tapered shape of wiring, the upper limit of the thickness is preferably 2 μm or less and more preferably 600 nm or less. The range of the thickness may be determined by any combination of the upper limit and the lower limit.

The Al alloy film is preferably used for various wiring materials, such as source-drain electrodes and a gate electrode in a display device. In particular, the Al alloy film is more preferably used as a wiring material for a gate electrode required to have high-temperature heat resistance.

The Al alloy film is preferably used for various electrode materials, such as an emitter electrode and a collector electrode in a semiconductor device. In particular, the Al alloy film is more preferably used as a wiring material for an emitter electrode required to have high-temperature heat resistance.

The Al alloy film is preferably formed by a sputtering method with a sputtering target (hereinafter, also referred to as a "target") because a thin film having excellent in-plane uniformity in components and thickness can be easily formed, compared with the case where a thin film is formed by an ion-plating method, an electron-beam evaporation method, or a vacuum evaporation method.

In the case where the Al alloy film is formed by the sputtering method, an Al alloy sputtering target containing the foregoing elements and having a composition the same as the composition of a desired Al alloy film is suitably used as the target because the use of the target eliminates composition deviation and results in the formation of an Al alloy film having an intended composition.

In the present invention, sputtering targets having the same compositions as the first, second, and third Al alloy films are also included in the scope of the present invention. Specifically, the targets include (i) a target containing 0.01 to 2.0 atomic percent of Ge, 0.1 to 5 atomic percent of at least one element selected from the group (group X) consisting of Ta, Ti, Zr, W, Cr, Nb, Mo, Ir, Pt, Re, and Pt, and the balance being Al and incidental impurities (a target for the first Al alloy film); (ii) a target containing 0.1 to 0.45 atomic percent of at least one rare-earth element in addition to (i) (a target for the second Al alloy film); and (iii) a target further containing 0.1 to 0.35 atomic percent of at least one element selected from the group consisting of Ni, Co, and Fe, in addition to (i) or (ii); (a target for the third Al film).

With respect to the shape of the target, the target may be processed into any shape (a square plate-like shape, a circular plate-like shape, a doughnut plate-like shape, a cylinder shape, or the like) corresponding to the shape and structure of a sputtering apparatus.

Examples of a method for producing the target include a method in which an ingot composed of an Al-base alloy is produced by a melt-casting process, a powder sintering process, or a spray forming process to form a target; and a method in which after a preform (intermediate before the final dense product) composed of an Al-based alloy is produced, the preform is densified by densification means to form a target.

The present invention includes a display device characterized in that the Al alloy film is used for a thin film transistor. Examples of an embodiment of the present invention include an embodiment in which the Al alloy films are used for a source electrode and/or a drain electrode of the thin film transistor, and a signal line, and in which the drain electrode is directly connected to a transparent conductive film; and an embodiment in which the Al alloy films are used for a gate electrode and a scan line. In the case where the first and second Al alloy films are used, the Al alloy films are preferably connected to the transparent conductive film with a refractory metal film or a refractory alloy film (barrier metal) containing at least one element selected from the group consisting of Mo, Ti, W, and Cr. In the case where the third Al alloy film is used, it may be connected to the transparent conductive film with a barrier metal, or alternatively, the Al alloy film can be directly connected to the transparent conductive film without using the barrier metal.

Furthermore, the case where the gate electrode, the scan line, the source electrode and/or the drain electrode, and the signal line are formed of the Al alloy film having the same composition is included as an embodiment.

A transparent pixel electrode used in the present invention is not particularly limited. Examples thereof include indium tin oxide (ITO) and indium zinc oxide (IZO).

A semiconductor layer used in the present invention is not particularly limited. Examples thereof include amorphous silicon, polycrystalline silicon, continuous grain silicon, and oxide semiconductor material.

To produce the display device including the Al alloy film of the present invention, a common process for producing a display device may be employed. For example, the production methods described in patent literatures 1 to 5 described above may be referenced.

Figure 3:
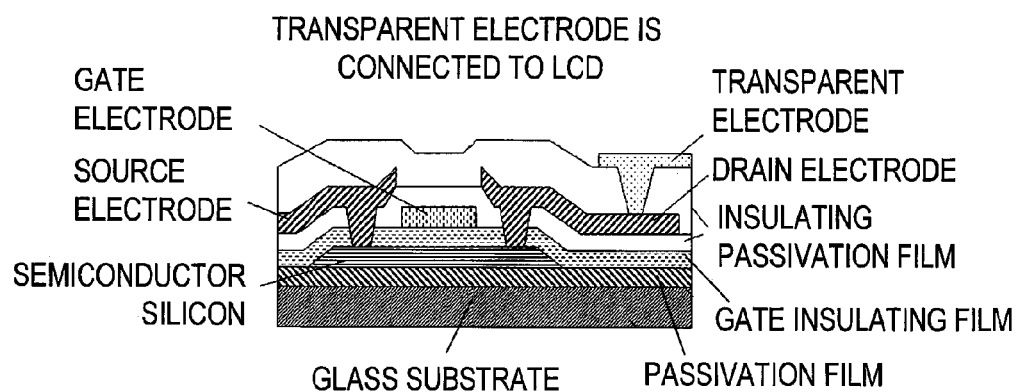
FIG. 3 is a schematic cross-sectional view of an exemplary liquid crystal display.
Figure 4:
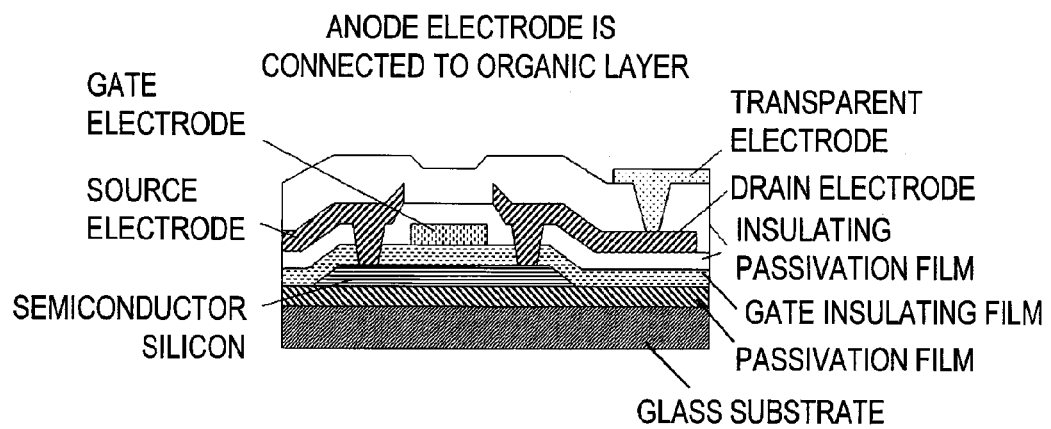
FIG. 4 is a schematic cross-sectional view of an exemplary organic electroluminescent (EL) display.
Figure 5:
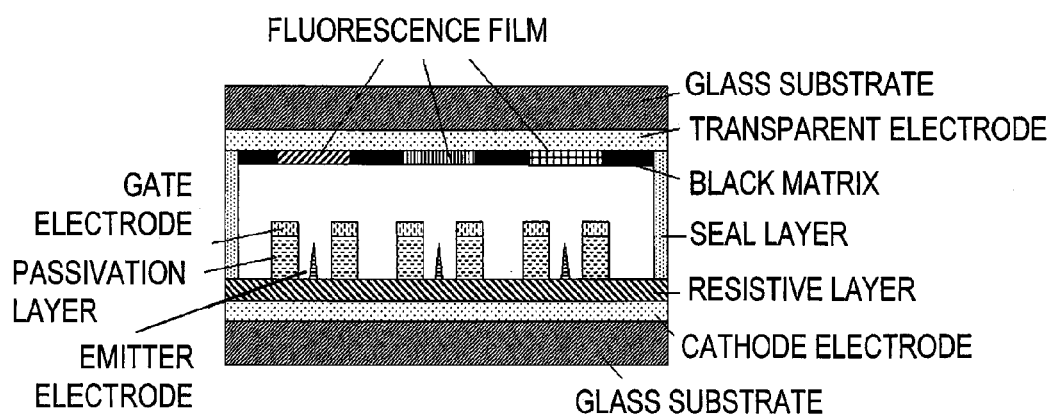
FIG. 5 is a schematic cross-sectional view of an exemplary field emission display.
Figure 6:
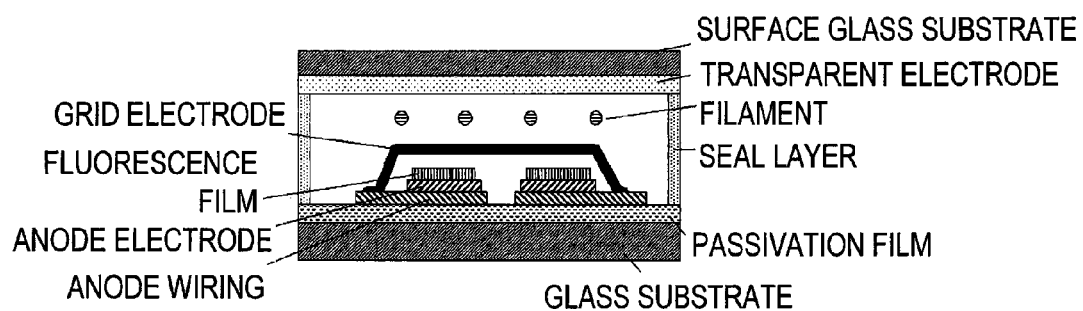
FIG. 6 is a schematic cross-sectional view of an exemplary vacuum fluorescent display.
Figure 7:
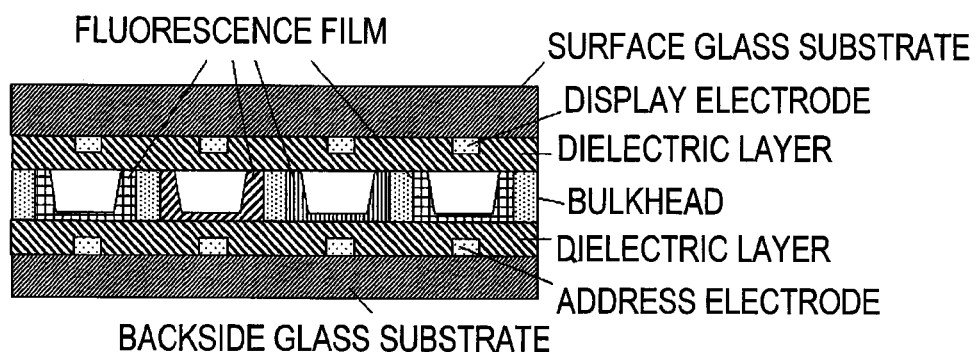
FIG. 7 is a schematic cross-sectional view of an exemplary plasma display.
Figure 8:
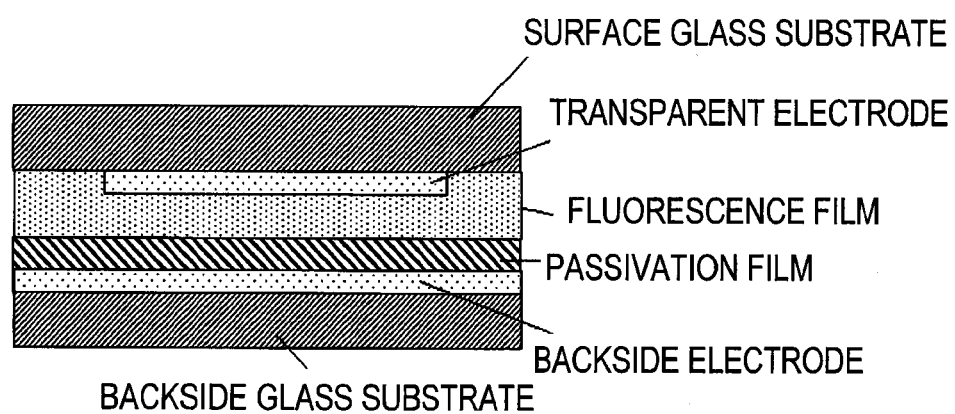
FIG. 8 is a schematic cross-sectional view of an exemplary inorganic electroluminescent (EL) display.
Figure 9:
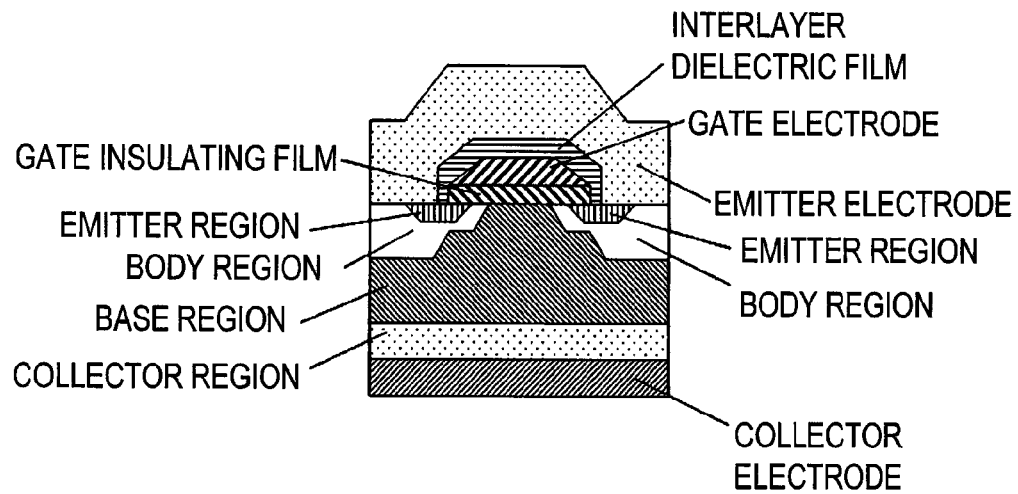
FIG. 9 is a schematic cross-sectional view of a typical insulated gate bipolar transistor (IGBT).

As a liquid crystal display device, a liquid crystal display is representatively described above. The foregoing Al alloy film for use in a display device according to the present invention may be mainly used as electrodes and wiring materials in various liquid crystal display devices. Examples of the electrodes and wiring materials include gate, source, and drain electrodes for a thin film transistor and a wiring material in a liquid crystal display (LCD) as illustrated in FIG. 3; gate, source, and drain electrodes for a thin film transistor and a wiring material in an organic EL (OLED) as illustrated in FIG. 4; cathode and gate electrodes and a wiring material in a field emission display (FED) as illustrated in FIG. 5; an anode electrode and a wiring material in a vacuum fluorescent display (VFD) as illustrated in FIG. 6; an address electrode and a wiring material in a plasma display panel (PDP) as illustrated in FIG. 7; and a back electrode in an inorganic EL as illustrated in FIG. 8. The foregoing Al alloy film for use in a semiconductor device according to the present invention may be mainly used as electrodes and wiring materials in various semiconductor devices. Examples of the electrodes and wiring materials include emitter and collector electrodes and a wiring material in an IGBT as illustrated in FIG. 9. Our experimental results demonstrate that in the case where the Al alloy film for use in a display device and a semiconductor device according to the present invention is used for the liquid crystal display and semiconductor devices, the predetermined effects described above are provided.

Further, within the embodiment of the present invention are an Al alloy film which is etched with a halogen gas or a gas containing a compound having halogen as well as an Al alloy film which is etched with a acid solution of pH of 3 or less.

Figure 10:
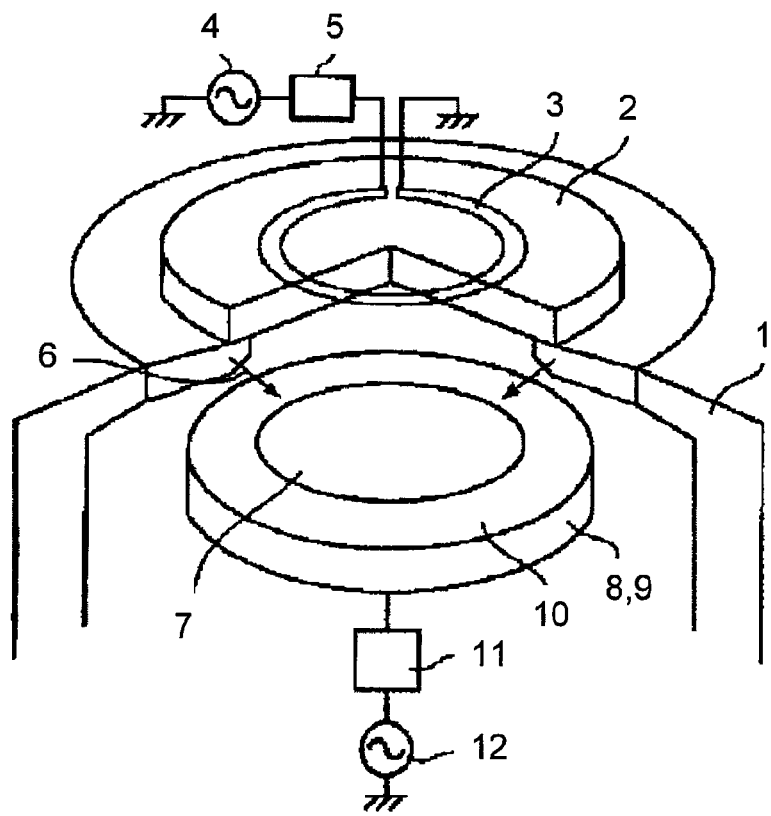
FIG. 10 illustrates a cross-sectional structure of a dry-etching apparatus.

The present invention does not limit the method of a dry-etching treatment, a device for use in the dry-etching treatment, and the like. For example, by means of a general-purpose dry-etching device as shown in FIG. 10, a general dry-etching step can be performed. In Examples described later, an ICP (induction coupling plasma) type dry-etching device shown in FIG. 10 was used.

A typical dry-etching treatment using the dry-etching device of FIG. 10 is described below, which should not be construed as limiting in any way.

In the device of FIG. 10, at the upper part of a chamber 1, there is a dielectric window 2. On the dielectric window 2, a one-turn antenna 3 is mounted. The plasma generation device of FIG. 10 is for the one referred to as a so-called TCP (Transfer Coupled Plasma) for which the dielectric window 2 is of a flat plate type. To the antenna 3, a 13.56-MHz high-frequency power 4 is introduced via a matching box 5.

In the chamber 1, there is a process gas inlet 6, through which an etching gas including a halogen gas such as $Cl_2$ is introduced. The substrate (to-be-etched material) 7 is mounted on a susceptor 8. The susceptor 8 serves as an electrostatic chuck 9, which is configured to be capable of chucking with an electrostatic force by electric charges flowed from the plasma to the substrate. At the periphery of the susceptor 8, a member referred to as a collar 10 of quartz glass is mounted.

The halogen gas introduced into the chamber 1 is rendered in an excited state, and is converted into a plasma by a dielectric magnetic field caused by applying a high frequency power to the antenna 3 situated on the dielectric window 2.

Further, to the susceptor 8, a 400-kHz high frequency power 12 is introduced via the matching box 11. Thus, a high-frequency bias is applied to the substrate (to-be-etched material) 7 mounted on the susceptor 8. By this high-frequency bias, the ions in the plasma are drawn with anisotropy to the substrate, which enables anisotropic etching such as perpendicular etching.

A typical wet-etching treatment using a acid solution is described below, which should not be construed as limiting in any way.

Isotropic etching can be conducted by immersing a substrate (to-be-etched material) or spraying to a substrate a solution containing phosphoric acid (45 to 80 weight percent), nitric acid (1 to 10 weight percent), organic acid such as acetic acid (1 to 10 weight percent) and the balance being water.

EXAMPLES

The present invention is more specifically described below by presenting examples. The present invention is not limited to these examples described below. The present invention may be modified and performed without departing from the essence of the present invention described above and below. They are also within the technical scope of the present invention.

Example 1

Al alloy films (thickness: 300 nm) having various alloy compositions described in Tables 1 to 6 were formed by a DC magnetron sputtering method (substrate: glass substrate (Eagle 2000, manufactured by Corning Inc.), atmospheric gas: argon, pressure: 2 mTorr, and substrate temperature: 25° C. (room temperature)).

In the formation of the Al alloy films having various alloy compositions, Al alloy targets having various compositions produced by a vacuum melting method were used.

Proportions of alloy elements in various Al alloy films used in the examples were determined by inductively coupled plasma spectrometry (ICP).

Each Al alloy film formed as described above was subjected to high-temperature heat treatment twice at 450° C. to 600° C. With respect to each of the Al alloy films after the high-temperature heat treatment, properties of heat resistance, the electrical resistance (wiring resistance) of the Al alloy film itself, dry-etching property, resistance to an alkaline solution, resistance to a stripping solution, contact resistance with ITO, and the size and density of precipitates were measured by methods described below. For the purpose of reference, with respect to heat resistance, an experiment at 350° C. was also conducted. With respect to resistance to an organic alkaline developer, an experiment was made on an as-deposited Al alloy film without heat treatment. This is because in a TFT fabrication process, the Al alloy film is exposed to an alkaline environment in a photolithography step of forming Al alloy wiring before subjected to heat treatment.

(1) Heat Resistance after Heat Treatment

Each as-deposited Al alloy film was subjected to heat treatment twice in an inert ($N_2$) gas atmosphere at temperatures described in Tables 1 to 6 for 10 minutes for each heat treatment. The surface morphology of the films were observed with an optical microscope (magnification: ×500) to measure the density of hillocks (particles/$m^2$). The heat resistance was evaluated according to evaluation criteria described in Table 7. In this example, ⊙ or ○ indicates that the corresponding films were acceptable.

(2) Dry-Etching Property

Specifically, on a silicon substrate with a diameter of 4 inches and a thickness of 0.7 μm, a silicon oxide (SiOx) film with a thickness of 200 nm, followed by deposition of an Al alloy film with a thickness of 500 nm using the conditions described above. Then, with g-line photolithography, a positive type photoresist (novolak type resin; TSMR8900 manufactured by TOKYO OHKA KOGYO Co., Ltd., 1.0 μm in thickness) was formed in a stripe with a line width of 10 μm. Then, by means of the dry etching apparatus shown in FIG. 10 described above, dry-etching was conducted under the following etching conditions.

(Etching Conditions)

Ar/$Cl_2$: 300 sccm/180 sccm

Electrical power input on antenna (source RF): 500 W

Substrate bias: 60 W

Process pressure (gas pressure): 14 mTorr

Substrate temperature: susceptor temperature (20° C.)

Etching was carried out by changing the etching time in such a range as to achieve an etching depth of 100 to 300 nm, thereby to manufacture samples having different etching depths. Then, by way of ashing process using oxygen plasma, the resist was removed using amine system stripping solution and the like. Then, by means of a stylus type thickness meter ("Dektak II" manufactured by Vecco Co.), the etching thickness of the pure Al or Al alloy film was measured. The dry-etching property was evaluated according to evaluation criteria described in Table 7. In this example, ⊙ or ○ indicates that the corresponding films were acceptable.

(3) Wiring Resistance of al Alloy Film after Heat Treatment

A 10 μm line-and-space pattern formed on each of the as-deposited Al alloy films was subjected to heat treatment twice in an inert ($N_2$) gas atmosphere at 450° C., 550° C., or 600° C. for 10 minutes for each heat treatment. The electrical resistance was determined by a 4-point probes method. The wiring resistance for each temperature was evaluated according to evaluation criteria described in Table 7. In this example, ⊙ or ○ indicates that the corresponding films were acceptable.

(4) Direct Contact Resistance with Transparent Pixel Electrode

Figure 2:
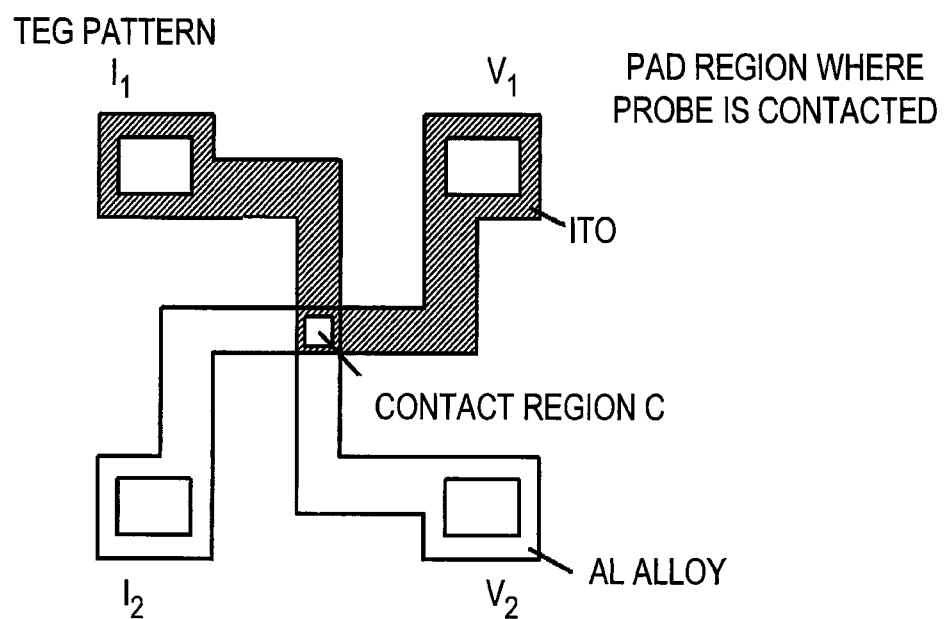
FIG. 2 illustrates a Kelvin pattern (TEG pattern) used for the measurement of the contact resistance between an Al alloy film and a transparent pixel electrode.

Each as-deposited Al alloy film was subjected to heat treatment twice in an inert ($N_2$) gas atmosphere at 600° C. for 10 minutes for each heat treatment. The contact resistance when the resulting Al alloy film was in direct contact with a transparent pixel electrode was measured as follows: A Kelvin pattern (contact hole size: 10 μm×10 μm square) illustrated in FIG. 2 was formed as the transparent pixel electrode (indium tin oxide (ITO): indium oxide containing 10% by mass tin oxide) by sputtering under conditions described below, and a 4-point probes measurement (a current was passed between ITO and the Al alloy film, and a voltage drop between ITO and the Al alloy was measured with other terminals) was performed. Specifically, a current I was passed between $I_1$ and $I_2$ in FIG. 2, and a voltage V between $V_1$ and $V_2$ was monitored. A direct contact resistance R at contact hole C was calculated from the expression $[R=(V_2-V_1)/I_2]$. The direct contact resistance with ITO (contact resistance with ITO) was evaluated according to evaluation criteria described in Table 7. In this example, ⊙ or ○ indicates that the corresponding films were acceptable.

(Deposition Conditions of Transparent Pixel Electrode)

Atmospheric gas: argon

Pressure: 0.8 mTorr

Substrate temperature: 25° C. (room temperature)

(5) Resistance to Stripping Solution

A corrosion experiment with an alkaline dilution containing an amine-based photoresist and water was performed in a manner simulating a wet cleaning step with a photoresist stripping solution. Specifically, each as-deposited Al alloy film was subjected to heat treatment twice in an inert ($N_2$) gas atmosphere at 600° C. for 20 minutes for each heat treatment and then immersed in aqueous amine-based resist stripping solutions (TOK 106, manufactured by Tokyo Ohka Kogyo Co., Ltd.) with pH values adjusted to 10.5 and 9.5 (solution temperature: 25° C.). Specifically, the film was immersed in the solution with a pH of 10.5 for 1 minute and consecutively immersed in the solution with a pH of 9.5 for 5 minutes. The number of crater-like corrosion (pitting corrosion) marks (each having an equivalent circle diameter of 150 nm or more) observed on a surface of the film after immersion was studied (observation magnification: ×1,000). The resistance to the stripping solution was evaluated according to evaluation criteria described in Table 7. In this example, ⊙ or ○ indicates that the corresponding films were acceptable.

(6) Resistance to Organic Alkaline Developer (Measurement of Etch Rate in Developer)

After a mask was formed on each Al alloy film formed on the substrate, the Al alloy film was immersed in a developer (an aqueous solution containing 2.38% by mass TMAH) at 25° C. for 1 minute and 2 minutes. The amount etched was measured with a profilometer. Etching rate is calculated from the difference in the etched amounts between the films immersed for 1 minute and 2 minutes. The resistance to the alkaline developer was evaluated according to evaluation criteria described in Table 7. In this example, ⊙ or ○ indicates that the corresponding films were acceptable.

(7) Measurement of Precipitate

Each as-deposited Al alloy film was subjected to heat treatment twice in an inert ($N_2$) gas atmosphere at 550° C. or 600° C. for 10 minutes for each heat treatment. The resulting precipitates were observed with a planar transmission electron microscope (TEM, magnification: ×300,000). The size (equivalent circle diameter) and the density (particles/mm$^2$) of the precipitates were determined on the basis of reflection electron images obtained with a scanning electron microscope. Specifically, the equivalent circle diameters and the number of precipitates observed in one field of view (mm$^2$) were measured, and the mean values in three fields of view were determined. Elements in the precipitates were identified by TEM-EDX analysis. The size and the density of the precipitates were classified according to evaluation criteria described in Table 7. Precipitates that meet the size requirement represented by ⊙, ○, or Δ and the density requirement represented by ⊙ or ○ satisfy the requirement of the present invention.

Note that starting from the left, the size and the density of the first precipitates, the second precipitates, the third precipitates, the fourth precipitates, and the fifth precipitates are described in FIGS. 1 to 6.

Tables 1 to 6 summarize the results.

TABLE 1

| No. | Composition of Al alloy film (balance: Al and incidental impurities) | Precipitate size 550° C. | Precipitate size 600° C. | Precipitate density 550° C. | Precipitate density 600° C. |
|---|---|---|---|---|---|
| 1-1 | Al—0.5 at % Ge—0.5 at % Ta—0.5 at % Zr—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-2 | Al—0.1 at % Ge—0.5 at % Ta—0.5 at % Zr—0.2 at % Nd—0.1 at % Ni | ⊙⊙⊙⊙⊙ | ⊙⊙⊙⊙⊙ | ○○○○○ | ○○○○○ |
| 1-3 | Al—2.0 at % Ge—0.5 at % Ta—0.5 at % Zr—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-4 | Al—0.5 at % Ge—0.1 at % Ta—0.1 at % Zr—0.2 at % Nd—0.1 at % Ni | ⊙⊙⊙⊙⊙ | ⊙⊙⊙⊙⊙ | ○○○○○ | ○○○○○ |
| 1-5 | Al—0.5 at % Ge—0.3 at % Ta—0.3 at % Zr—0.2 at % Nd—0.1 at % Ni | ⊙⊙⊙⊙⊙ | ⊙⊙⊙⊙⊙ | ○○○○○ | ○○○○○ |
| 1-6 | Al—0.5 at % Ge—1.0 at % Ta—1.0 at % Zr—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-7 | Al—0.5 at % Ge—2.5 at % Ta—2.5 at % Zr—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-8 | Al—0.5 at % Ge—0.5 at % Ta—0.5 at % Zr—0.1 at % Nd—0.1 at % Ni | ⊙⊙⊙⊙⊙ | ⊙⊙⊙⊙⊙ | ⊙⊙○○⊙ | ⊙⊙○○⊙ |
| 1-9 | Al—0.5 at % Ge—0.5 at % Ta—0.5 at % Zr—0.45 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-10 | Al—0.5 at % Ge—0.5 at % Ta—0.5 at % Zr—0.2 at % Nd—0.35 at % Ni | ⊙⊙⊙⊙⊙ | ⊙⊙⊙⊙⊙ | ⊙⊙⊙⊙⊙ | ⊙⊙⊙⊙⊙ |
| 1-11 | Al—0.5 at % Ge—0.5 at % Ti—0.5 at % Zr—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-12 | Al—0.5 at % Ge—0.5 at % Ta—0.5 at % Zr—0.2 at % La—0.1 at % Ni | ⊙⊙⊙⊙⊙ | ⊙⊙⊙⊙⊙ | ⊙⊙⊙⊙⊙ | ⊙⊙⊙⊙⊙ |
| 1-13 | Al—0.5 at % Ge—0.5 at % Ta—0.5 at % Zr—0.2 at % Gd—0.1 at % Ni | ⊙⊙⊙⊙⊙ | ⊙⊙⊙⊙⊙ | ⊙⊙⊙⊙⊙ | ⊙⊙⊙⊙⊙ |
| 1-14 | Al—0.5 at % Ge—0.5 at % Ta—0.5 at % Zr—0.2 at % Ce—0.1 at % Ni | ⊙⊙⊙⊙⊙ | ⊙⊙⊙⊙⊙ | ⊙⊙⊙⊙⊙ | ⊙⊙⊙⊙⊙ |
| 1-15 | Al—0.5 at % Ge—0.5 at % Ta—0.5 at % Zr—0.2 at % Dy—0.1 at % Ni | ⊙⊙⊙⊙⊙ | ⊙⊙⊙⊙⊙ | ⊙⊙⊙⊙⊙ | ⊙⊙⊙⊙⊙ |
| 1-16 | Al—0.5 at % Ge—0.5 at % Ta—0.5 at % Zr—0.2 at % Sm—0.1 at % Ni | ⊙⊙⊙⊙⊙ | ⊙⊙⊙⊙⊙ | ⊙⊙⊙⊙⊙ | ⊙⊙⊙⊙⊙ |
| 1-17 | Al—0.5 at % Ge—0.5 at % Ta—0.5 at % Hf—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-18 | Al—0.1 at % Ge—0.5 at % Ta—0.5 at % Hf—0.2 at % Nd—0.1 at % Ni | ⊙⊙⊙⊙⊙ | ⊙⊙⊙⊙⊙ | ○○○○○ | ○○○○○ |
| 1-19 | Al—2.0 at % Ge—0.5 at % Ta—0.5 at % Hf—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-20 | Al—0.5 at % Ge—0.1 at % Ta—0.1 at % Hf—0.2 at % Nd—0.1 at % Ni | ⊙⊙⊙⊙⊙ | ⊙⊙⊙⊙⊙ | ○○○○○ | ○○○○○ |
| 1-21 | Al—0.5 at % Ge—0.3 at % Ta—0.3 at % Hf—0.2 at % Nd—0.1 at % Ni | ⊙⊙⊙⊙⊙ | ⊙⊙⊙⊙⊙ | ○○○○○ | ○○○○○ |
| 1-22 | Al—0.5 at % Ge—1.0 at % Ta—1.0 at % Hf—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-23 | Al—0.5 at % Ge—2.5 at % Ta—2.5 at % Hf—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-24 | Al—0.5 at % Ge—0.5 at % Ta—0.5 at % Hf—0.1 at % Nd—0.1 at % Ni | ⊙⊙⊙⊙⊙ | ⊙⊙⊙⊙⊙ | ⊙⊙○○⊙ | ⊙⊙○○⊙ |
| 1-25 | Al—0.5 at % Ge—0.5 at % Ta—0.5 at % Hf—0.45 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-26 | Al—0.5 at % Ge—0.5 at % Ta—0.5 at % Hf—0.2 at % Nd—0.35 at % Ni | ⊙⊙⊙⊙⊙ | ⊙⊙⊙⊙⊙ | ⊙⊙⊙⊙⊙ | ⊙⊙⊙⊙⊙ |
| 1-27 | Al—0.5 at % Ge—0.5 at % Ti—0.5 at % Hf—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ |
| 1-28 | Al—0.5 at % Ge—0.5 at % Ta—0.5 at % Hf—0.2 at % La—0.1 at % Ni | ⊙⊙⊙⊙⊙ | ⊙⊙⊙⊙⊙ | ⊙⊙⊙⊙⊙ | ⊙⊙⊙⊙⊙ |
| 1-29 | Al—0.5 at % Ge—0.5 at % Ta—0.5 at % Hf—0.2 at % Gd—0.1 at % Ni | ⊙⊙⊙⊙⊙ | ⊙⊙⊙⊙⊙ | ⊙⊙⊙⊙⊙ | ⊙⊙⊙⊙⊙ |
| 1-30 | Al—0.5 at % Ge—0.5 at % Ta—0.5 at % Hf—0.2 at % Ce—0.1 at % Ni | ⊙⊙⊙⊙⊙ | ⊙⊙⊙⊙⊙ | ⊙⊙⊙⊙⊙ | ⊙⊙⊙⊙⊙ |
| 1-31 | Al—0.5 at % Ge—0.5 at % Ta—0.5 at % Hf—0.2 at % Dy—0.1 at % Ni | ⊙⊙⊙⊙⊙ | ⊙⊙⊙⊙⊙ | ⊙⊙⊙⊙⊙ | ⊙⊙⊙⊙⊙ |
| 1-32 | Al—0.5 at % Ge—0.5 at % Ta—0.5 at % Hf—0.2 at % Sm—0.1 at % Ni | ⊙⊙⊙⊙⊙ | ⊙⊙⊙⊙⊙ | ⊙⊙⊙⊙⊙ | ⊙⊙⊙⊙⊙ |

| No. | (1) Heat resistance 350° C. | (1) Heat resistance 450° C. | (1) Heat resistance 550° C. | (1) Heat resistance 600° C. | (2) Dry-etching property | (3) Wiring resistance 450° C. | (3) Wiring resistance 550° C. | (3) Wiring resistance 600° C. | (4) Contact resistance with ITO 600° C. | (5) Resistance to stripping solution 600° C. | (6) Resistance to alkaline developer |
|---|---|---|---|---|---|---|---|---|---|---|---|
| 1-1 | ⊙ | ⊙ | ⊙ | ⊙ | ⊙ | ⊙ | ⊙ | ⊙ | ○ | ⊙ | ○ |
| 1-2 | ⊙ | ⊙ | ⊙ | ○ | ⊙ | ⊙ | ⊙ | ⊙ | ○ | ⊙ | ○ |
| 1-3 | ⊙ | ⊙ | ⊙ | ⊙ | ⊙ | ⊙ | ○ | ⊙ | ○ | ⊙ | ○ |
| 1-4 | ⊙ | ⊙ | ⊙ | ○ | ⊙ | ⊙ | ⊙ | ⊙ | ○ | ⊙ | ○ |
| 1-5 | ⊙ | ⊙ | ⊙ | ○ | ⊙ | ⊙ | ⊙ | ⊙ | ○ | ⊙ | ○ |
| 1-6 | ⊙ | ⊙ | ⊙ | ⊙ | ⊙ | ⊙ | ⊙ | ⊙ | ○ | ⊙ | ○ |
| 1-7 | ⊙ | ⊙ | ⊙ | ⊙ | ⊙ | ○ | ○ | ○ | ○ | ⊙ | ○ |
| 1-8 | ⊙ | ⊙ | ⊙ | ⊙ | ⊙ | ○ | ⊙ | ⊙ | ○ | ⊙ | ○ |
| 1-9 | ⊙ | ⊙ | ⊙ | ⊙ | ⊙ | ○ | ⊙ | ⊙ | ○ | ⊙ | ○ |
| 1-10 | ⊙ | ⊙ | ⊙ | ⊙ | ⊙ | ○ | ⊙ | ⊙ | ○ | ⊙ | ○ |
| 1-11 | ⊙ | ⊙ | ⊙ | ⊙ | ⊙ | ⊙ | ⊙ | ⊙ | ○ | ⊙ | ○ |
| 1-12 | ⊙ | ⊙ | ⊙ | ⊙ | ⊙ | ⊙ | ⊙ | ⊙ | ○ | ⊙ | ○ |
| 1-13 | ⊙ | ⊙ | ⊙ | ⊙ | ⊙ | ⊙ | ⊙ | ⊙ | ○ | ⊙ | ○ |
| 1-14 | ⊙ | ⊙ | ⊙ | ⊙ | ⊙ | ⊙ | ⊙ | ⊙ | ○ | ⊙ | ○ |
| 1-15 | ⊙ | ⊙ | ⊙ | ⊙ | ⊙ | ⊙ | ⊙ | ⊙ | ○ | ⊙ | ○ |
| 1-16 | ⊙ | ⊙ | ⊙ | ⊙ | ⊙ | ⊙ | ⊙ | ⊙ | ○ | ⊙ | ○ |
| 1-17 | ⊙ | ⊙ | ⊙ | ⊙ | ⊙ | ⊙ | ⊙ | ⊙ | ○ | ⊙ | ○ |
| 1-18 | ⊙ | ⊙ | ⊙ | ○ | ⊙ | ⊙ | ⊙ | ⊙ | ○ | ⊙ | ○ |
| 1-19 | ⊙ | ⊙ | ⊙ | ○ | ⊙ | ⊙ | ⊙ | ⊙ | ○ | ⊙ | ○ |
| 1-20 | ⊙ | ⊙ | ⊙ | ○ | ⊙ | ⊙ | ⊙ | ⊙ | ○ | ⊙ | ○ |
| 1-21 | ⊙ | ⊙ | ⊙ | ⊙ | ⊙ | ⊙ | ⊙ | ⊙ | ○ | ⊙ | ○ |
| 1-22 | ⊙ | ⊙ | ⊙ | ⊙ | ⊙ | ⊙ | ⊙ | ⊙ | ○ | ⊙ | ○ |
| 1-23 | ⊙ | ⊙ | ⊙ | ⊙ | ⊙ | ○ | ○ | ○ | ○ | ⊙ | ○ |

TABLE 1-continued

| | | | | | | | | | | | |
|---|---|---|---|---|---|---|---|---|---|---|---|
| 1-24 | ⊙ | ⊙ | ⊙ | ○ | ⊙ | ⊙ | ⊙ | ⊙ | ○ | ⊙ | ○ |
| 1-25 | ⊙ | ⊙ | ⊙ | ⊙ | ○ | ⊙ | ⊙ | ⊙ | ○ | ⊙ | ○ |
| 1-26 | ⊙ | ⊙ | ⊙ | ⊙ | ⊙ | ⊙ | ⊙ | ⊙ | ○ | ⊙ | ○ |
| 1-27 | ⊙ | ⊙ | ⊙ | ⊙ | ⊙ | ⊙ | ⊙ | ⊙ | ○ | ⊙ | ○ |
| 1-28 | ⊙ | ⊙ | ⊙ | ⊙ | ⊙ | ⊙ | ⊙ | ⊙ | ○ | ⊙ | ○ |
| 1-29 | ⊙ | ⊙ | ⊙ | ⊙ | ⊙ | ⊙ | ⊙ | ⊙ | ○ | ⊙ | ○ |
| 1-30 | ⊙ | ⊙ | ⊙ | ⊙ | ⊙ | ⊙ | ⊙ | ⊙ | ○ | ⊙ | ○ |
| 1-31 | ⊙ | ⊙ | ⊙ | ⊙ | ⊙ | ⊙ | ⊙ | ⊙ | ○ | ⊙ | ○ |
| 1-32 | ⊙ | ⊙ | ⊙ | ⊙ | ⊙ | ⊙ | ⊙ | ⊙ | ○ | ⊙ | ○ |

TABLE 2

| No. | Composition of Al alloy film (balance: Al and incidental impurities) | Precipitate size 550° C. | Precipitate size 600° C. | Precipitate density 550° C. | Precipitate density 600° C. | (1) Heat resistance 350° C. | (1) Heat resistance 450° C. |
|---|---|---|---|---|---|---|---|
| 2-1 | Al—0.5 at % Ge—0.1 at % Ta—0.2 at % Nd—0.1 at % Ni | ⊙X⊙⊙ | ⊙X⊙⊙ | ○X○○ | ○X○○ | ⊙ | ⊙ |
| 2-2 | Al—0.5 at % Ge—0.5 at % Ta—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-3 | Al—0.5 at % Ge—1.0 at % Ta—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-4 | Al—0.5 at % Ge—5.0 at % Ta—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-5 | Al—0.5 at % Ge—0.1 at % Ti—0.2 at % Nd—0.1 at % Ni | ⊙X⊙⊙ | ⊙X⊙⊙ | ○X○○ | ○X○○ | ⊙ | ⊙ |
| 2-6 | Al—0.5 at % Ge—0.5 at % Ti—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-7 | Al—0.5 at % Ge—1.0 at % Ti—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-8 | Al—0.5 at % Ge—5.0 at % Ti—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-9 | Al—0.5 at % Ge—0.1 at % Zr—0.2 at % Nd—0.1 at % Ni | ⊙X⊙⊙ | ⊙X⊙⊙ | ○X○○ | ○X○○ | ⊙ | ⊙ |
| 2-10 | Al—0.5 at % Ge—0.5 at % Zr—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-11 | Al—0.5 at % Ge—1.0 at % Zr—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-12 | Al—0.5 at % Ge—5.0 at % Zr—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-13 | Al—0.5 at % Ge—0.1 at % Hf—0.2 at % Nd—0.1 at % Ni | ⊙X⊙⊙ | ⊙X⊙⊙ | ○X○○ | ○X○○ | ⊙ | ⊙ |
| 2-14 | Al—0.5 at % Ge—0.5 at % Hf—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-15 | Al—0.5 at % Ge—1.0 at % Hf—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-16 | Al—0.5 at % Ge—5.0 at % Hf—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-17 | Al—0.5 at % Ge—0.5 at % W—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-18 | Al—0.5 at % Ge—0.5 at % Cr—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-19 | Al—0.5 at % Ge—0.5 at % Nb—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-20 | Al—0.5 at % Ge—0.5 at % Mo—0.2 at % Nd—0.1 at %Ni | ⊙X⊙⊙ | ⊙X⊙⊙ | ⊙X⊙⊙ | ⊙X⊙⊙ | ⊙ | ⊙ |
| 2-21 | Al—0.5 at % Ge—0.5 at % Ir—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-22 | Al—0.5 at % Ge—0.5 at % Pt—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-23 | Al—0.5 at % Ge—0.5 at % Re—0.2 at % Nd—0.1 at % Ni | ⊙X⊙⊙ | ⊙X⊙⊙ | ⊙X⊙⊙ | ⊙X⊙⊙ | ⊙ | ⊙ |
| 2-24 | Al—0.5 at % Ge—0.5 at % Os—0.2 at % Nd—0.1 at % Ni | ⊙X⊙⊙ | ⊙X⊙⊙ | ⊙X⊙⊙ | ⊙X⊙⊙ | ⊙ | ⊙ |

| No. | (1) Heat resistance 550° C. | (1) Heat resistance 600° C. | (2) Dry-etching property — | (3) Wiring resistance 450° C. | (3) Wiring resistance 550° C. | (3) Wiring resistance 600° C. | (4) Contact resistance with ITO 600° C. | (5) Resistance to stripping solution 600° C. | (6) Resistance to alkaline developer — |
|---|---|---|---|---|---|---|---|---|---|
| 2-1 | ○ | ○ | ⊙ | ⊙ | ⊙ | ⊙ | ○ | ⊙ | ○ |
| 2-2 | ⊙ | ○ | ⊙ | ⊙ | ⊙ | ⊙ | ○ | ⊙ | ○ |
| 2-3 | ⊙ | ○ | ⊙ | ⊙ | ⊙ | ⊙ | ○ | ⊙ | ○ |
| 2-4 | ⊙ | ○ | ○ | ⊙ | ⊙ | ⊙ | ○ | ⊙ | ○ |
| 2-5 | ○ | ○ | ⊙ | ⊙ | ⊙ | ⊙ | ○ | ⊙ | ○ |
| 2-6 | ⊙ | ○ | ⊙ | ⊙ | ⊙ | ⊙ | ○ | ⊙ | ○ |
| 2-7 | ⊙ | ○ | ⊙ | ⊙ | ⊙ | ⊙ | ○ | ⊙ | ○ |
| 2-8 | ⊙ | ○ | ○ | ⊙ | ⊙ | ⊙ | ○ | ⊙ | ○ |
| 2-9 | ○ | ○ | ⊙ | ⊙ | ⊙ | ⊙ | ○ | ⊙ | ○ |
| 2-10 | ⊙ | ○ | ⊙ | ⊙ | ⊙ | ⊙ | ○ | ⊙ | ○ |
| 2-11 | ⊙ | ○ | ⊙ | ⊙ | ⊙ | ⊙ | ○ | ⊙ | ○ |
| 2-12 | ⊙ | ○ | ○ | ⊙ | ⊙ | ⊙ | ○ | ⊙ | ○ |
| 2-13 | ○ | ○ | ⊙ | ⊙ | ⊙ | ⊙ | ○ | ⊙ | ○ |
| 2-14 | ⊙ | ○ | ⊙ | ⊙ | ⊙ | ⊙ | ○ | ⊙ | ○ |
| 2-15 | ⊙ | ○ | ⊙ | ⊙ | ⊙ | ⊙ | ○ | ⊙ | ○ |
| 2-16 | ⊙ | ○ | ○ | ⊙ | ⊙ | ⊙ | ○ | ⊙ | ○ |
| 2-17 | ⊙ | ○ | ⊙ | ⊙ | ⊙ | ⊙ | ○ | ⊙ | ○ |
| 2-18 | ⊙ | ○ | ⊙ | ⊙ | ⊙ | ⊙ | ○ | ⊙ | ○ |
| 2-19 | ⊙ | ○ | ⊙ | ⊙ | ⊙ | ⊙ | ○ | ⊙ | ○ |
| 2-20 | ⊙ | ○ | ⊙ | ⊙ | ⊙ | ⊙ | ○ | ⊙ | ○ |
| 2-21 | ⊙ | ○ | ⊙ | ⊙ | ⊙ | ⊙ | ○ | ⊙ | ○ |
| 2-22 | ⊙ | ○ | ⊙ | ⊙ | ⊙ | ⊙ | ○ | ⊙ | ○ |
| 2-23 | ⊙ | ○ | ⊙ | ⊙ | ⊙ | ⊙ | ○ | ⊙ | ○ |
| 2-24 | ⊙ | ○ | ⊙ | ⊙ | ⊙ | ⊙ | ○ | ⊙ | ○ |

TABLE 3

| No. | Composition of Al alloy film (balance: Al and incidental impurities) | Precipitate size 550° C. | Precipitate size 600° C. | Precipitate density 550° C. | Precipitate density 600° C. | (1) Heat resistance 350° C. | (1) Heat resistance 450° C. |
|---|---|---|---|---|---|---|---|
| 3-1 | Al—0.5 at % Ge—0.5 at % Ta—0.5 at % Zr—0.2 at % Nd | ◎◎◎◎X | ◎◎◎◎X | ◎◎◎◎X | ◎◎◎◎X | ◎ | ◎ |
| 3-2 | Al—0.1 at % Ge—0.5 at % Ta—0.5 at % Zr—0.2 at % Nd | ◎◎◎◎X | ◎◎◎◎X | ○○○○X | ○○○○X | ◎ | ◎ |
| 3-3 | Al—2.0 at % Ge—0.5 at % Ta—0.5 at % Zr—0.2 at % Nd | ◎◎◎◎X | ◎◎◎◎X | ◎◎◎◎X | ◎◎◎◎X | ◎ | ◎ |
| 3-4 | Al—0.5 at % Ge—0.1 at % Ta—0.1 at % Zr—0.2 at % Nd | ◎◎◎◎X | ◎◎◎◎X | ○○○○X | ○○○○X | ◎ | ◎ |
| 3-5 | Al—0.5 at % Ge—0.3 at % Ta—0.3 at % Zr—0.2 at % Nd | ◎◎◎◎X | ◎◎◎◎X | ○○○○X | ○○○○X | ◎ | ◎ |
| 3-6 | Al—0.5 at % Ge—1.0 at % Ta—1.0 at % Zr—0.2 at % Nd | ◎◎◎◎X | ◎◎◎◎X | ◎◎◎◎X | ◎◎◎◎X | ◎ | ◎ |
| 3-7 | Al—0.5 at % Ge—2.5 at % Ta—2.5 at % Zr—0.2 at % Nd | ◎◎◎◎X | ◎◎◎◎X | ◎◎◎◎X | ◎◎◎◎X | ◎ | ◎ |
| 3-8 | Al—0.5 at % Ge—0.5 at % Ta—0.5 at % Zr—0.1 at % Nd | ◎◎◎◎X | ◎◎◎◎X | ◎◎○○X | ◎◎○○X | ◎ | ◎ |
| 3-9 | Al—0.5 at % Ge—0.5 at % Ta—0.5 at % Zr—0.45 at % Nd | ◎◎◎◎X | ◎◎◎◎X | ◎◎◎◎X | ◎◎◎◎X | ◎ | ◎ |
| 3-10 | Al—0.5 at % Ge—0.5 at % Ti—0.5 at % Zr—0.2 at % Nd | ◎◎◎◎X | ◎◎◎◎X | ◎◎◎◎X | ◎◎◎◎X | ◎ | ◎ |
| 3-11 | Al—0.5 at % Ge—0.5 at % Ta—0.5 at % Zr—0.2 at % La | ◎◎◎◎X | ◎◎◎◎X | ◎◎◎◎X | ◎◎◎◎X | ◎ | ◎ |
| 3-12 | Al—0.5 at % Ge—0.5 at % Ta—0.5 at % Zr—0.2 at % Gd | ◎◎◎◎X | ◎◎◎◎X | ◎◎◎◎X | ◎◎◎◎X | ◎ | ◎ |
| 3-13 | Al—0.5 at % Ge—0.5 at % Ta—0.5 at % Zr—0.2 at % Ce | ◎◎◎◎X | ◎◎◎◎X | ◎◎◎◎X | ◎◎◎◎X | ◎ | ◎ |
| 3-14 | Al—0.5 at % Ge—0.5 at % Ta—0.5 at % Zr—0.2 at % Dy | ◎◎◎◎X | ◎◎◎◎X | ◎◎◎◎X | ◎◎◎◎X | ◎ | ◎ |
| 3-15 | Al—0.5 at % Ge—0.5 at % Ta—0.5 at % Zr—0.2 at % Sm | ◎◎◎◎X | ◎◎◎◎X | ◎◎◎◎X | ◎◎◎◎X | ◎ | ◎ |
| 3-16 | Al—0.5 at % Ge—0.5 at % Ta—0.5 at % Hf—0.2 at % Nd | ◎◎◎◎X | ◎◎◎◎X | ◎◎◎◎X | ◎◎◎◎X | ◎ | ◎ |
| 3-17 | Al—0.1 at % Ge—0.5 at % Ta—0.5 at % Hf—0.2 at % Nd | ◎◎◎◎X | ◎◎◎◎X | ○○○○X | ○○○○X | ◎ | ◎ |
| 3-18 | Al—2.0 at % Ge—0.5 at % Ta—0.5 at % Hf—0.2 at % Nd | ◎◎◎◎X | ◎◎◎◎X | ◎◎◎◎X | ◎◎◎◎X | ◎ | ◎ |
| 3-19 | Al—0.5 at % Ge—0.1 at % Ta—0.1 at % Hf—0.2 at % Nd | ◎◎◎◎X | ◎◎◎◎X | ○○○○X | ○○○○X | ◎ | ◎ |
| 3-20 | Al—0.5 at % Ge—0.3 at % Ta—0.3 at % Hf—0.2 at % Nd | ◎◎◎◎X | ◎◎◎◎X | ○○○○X | ○○○○X | ◎ | ◎ |
| 3-21 | Al—0.5 at % Ge—1.0 at % Ta—1.0 at % Hf—0.2 at % Nd | ◎◎◎◎X | ◎◎◎◎X | ◎◎◎◎X | ◎◎◎◎X | ◎ | ◎ |
| 3-22 | Al—0.5 at % Ge—2.5 at % Ta—2.5 at % Hf—0.2 at % Nd | ◎◎◎◎X | ◎◎◎◎X | ◎◎◎◎X | ◎◎◎◎X | ◎ | ◎ |
| 3-23 | Al—0.5 at % Ge—0.5 at % Ta—0.5 at % Hf—0.1 at % Nd | ◎◎◎◎X | ◎◎◎◎X | ◎◎○○X | ◎◎○○X | ◎ | ◎ |
| 3-24 | Al—0.5 at % Ge—0.5 at % Ta—0.5 at % Hf—0.45 at % Nd | ◎◎◎◎X | ◎◎◎◎X | ◎◎◎◎X | ◎◎◎◎X | ◎ | ◎ |
| 3-25 | Al—0.5 at % Ge—0.5 at % Ti—0.5 at % Hf—0.2 at % Nd | ◎◎◎◎X | ◎◎◎◎X | ◎◎◎◎X | ◎◎◎◎X | ◎ | ◎ |
| 3-26 | Al—0.5 at % Ge—0.5 at % Ta—0.5 at % Hf—0.2 at % La | ◎◎◎◎X | ◎◎◎◎X | ◎◎◎◎X | ◎◎◎◎X | ◎ | ◎ |
| 3-27 | Al—0.5 at % Ge—0.5 at % Ta—0.5 at % Hf—0.2 at % Gd | ◎◎◎◎X | ◎◎◎◎X | ◎◎◎◎X | ◎◎◎◎X | ◎ | ◎ |
| 3-28 | Al—0.5 at % Ge—0.5 at % Ta—0.5 at % Hf—0.2 at % Ce | ◎◎◎◎X | ◎◎◎◎X | ◎◎◎◎X | ◎◎◎◎X | ◎ | ◎ |
| 3-29 | Al—0.5 at % Ge—0.5 at % Ta—0.5 at % Hf—0.2 at % Dy | ◎◎◎◎X | ◎◎◎◎X | ◎◎◎◎X | ◎◎◎◎X | ◎ | ◎ |
| 3-30 | Al—0.5 at % Ge—0.5 at % Ta—0.5 at % Hf—0.2 at % Sm | ◎◎◎◎X | ◎◎◎◎X | ◎◎◎◎X | ◎◎◎◎X | ◎ | ◎ |

| No. | (1) Heat resistance 550° C. | (1) Heat resistance 600° C. | (2) Dry-etching property | (3) Wiring resistance 450° C. | (3) Wiring resistance 550° C. | (3) Wiring resistance 600° C. | (4) Contact resistance with ITO 600° C. | (5) Resistance to stripping solution 600° C. | (6) Resistance to alkaline developer |
|---|---|---|---|---|---|---|---|---|---|
| 3-1 | ◎ | ◎ | ◎ | ◎ | ◎ | ◎ | X | ◎ | ◎ |
| 3-2 | ◎ | ○ | ◎ | ◎ | ◎ | ◎ | X | ◎ | ◎ |
| 3-3 | ◎ | ◎ | ○ | ○ | ◎ | ◎ | X | ◎ | ◎ |
| 3-4 | ○ | ○ | ◎ | ◎ | ◎ | ◎ | X | ◎ | ◎ |
| 3-5 | ◎ | ◎ | ◎ | ◎ | ◎ | ◎ | X | ◎ | ◎ |
| 3-6 | ◎ | ◎ | ◎ | ◎ | ◎ | ◎ | X | ◎ | ◎ |
| 3-7 | ◎ | ◎ | ○ | ○ | ○ | ○ | X | ◎ | ◎ |
| 3-8 | ◎ | ○ | ◎ | ◎ | ◎ | ◎ | X | ◎ | ◎ |
| 3-9 | ◎ | ◎ | ○ | ◎ | ◎ | ◎ | X | ◎ | ◎ |
| 3-10 | ◎ | ◎ | ◎ | ◎ | ◎ | ◎ | X | ◎ | ◎ |
| 3-11 | ◎ | ◎ | ◎ | ◎ | ◎ | ◎ | X | ◎ | ◎ |
| 3-12 | ◎ | ◎ | ◎ | ◎ | ◎ | ◎ | X | ◎ | ◎ |
| 3-13 | ◎ | ◎ | ◎ | ◎ | ◎ | ◎ | X | ◎ | ◎ |
| 3-14 | ◎ | ◎ | ◎ | ◎ | ◎ | ◎ | X | ◎ | ◎ |
| 3-15 | ◎ | ◎ | ◎ | ◎ | ◎ | ◎ | X | ◎ | ◎ |
| 3-16 | ◎ | ◎ | ◎ | ◎ | ◎ | ◎ | X | ◎ | ◎ |
| 3-17 | ◎ | ○ | ◎ | ◎ | ◎ | ◎ | X | ◎ | ◎ |
| 3-18 | ◎ | ◎ | ○ | ○ | ◎ | ◎ | X | ◎ | ◎ |
| 3-19 | ○ | ○ | ◎ | ◎ | ◎ | ◎ | X | ◎ | ◎ |
| 3-20 | ◎ | ◎ | ◎ | ◎ | ◎ | ◎ | X | ◎ | ◎ |
| 3-21 | ◎ | ◎ | ◎ | ◎ | ◎ | ◎ | X | ◎ | ◎ |
| 3-22 | ◎ | ◎ | ○ | ○ | ○ | ○ | X | ◎ | ◎ |
| 3-23 | ◎ | ○ | ◎ | ◎ | ◎ | ◎ | X | ◎ | ◎ |
| 3-24 | ◎ | ◎ | ○ | ◎ | ◎ | ◎ | X | ◎ | ◎ |
| 3-25 | ◎ | ◎ | ◎ | ◎ | ◎ | ◎ | X | ◎ | ◎ |
| 3-26 | ◎ | ◎ | ◎ | ◎ | ◎ | ◎ | X | ◎ | ◎ |
| 3-27 | ◎ | ◎ | ◎ | ◎ | ◎ | ◎ | X | ◎ | ◎ |
| 3-28 | ◎ | ◎ | ◎ | ◎ | ◎ | ◎ | X | ◎ | ◎ |
| 3-29 | ◎ | ◎ | ◎ | ◎ | ◎ | ◎ | X | ◎ | ◎ |
| 3-30 | ◎ | ◎ | ◎ | ◎ | ◎ | ◎ | X | ◎ | ◎ |

TABLE 4

| No. | Composition of Al alloy film (balance: Al and incidental impurities) | Precipitate size 550° C. | Precipitate size 600° C. | Precipitate density 550° C. | Precipitate density 600° C. | (1) Heat resistance 350° C. | (1) Heat resistance 450° C. |
|---|---|---|---|---|---|---|---|
| 4-1 | Al—0.5 at % Ge—0.1 at % Ta—0.2 at % Nd | ⊙X⊙X | ⊙X⊙X | ○X○○X | ○X○○X | ⊙ | ⊙ |
| 4-2 | Al—0.5 at % Ge—0.5 at % Ta—0.2 at % Nd | ⊙X⊙X | ⊙X⊙X | ⊙X⊙X | ⊙X⊙X | ⊙ | ⊙ |
| 4-3 | Al—0.5 at % Ge—1.0 at % Ta—0.2 at % Nd | ⊙X⊙X | ⊙X⊙X | ⊙X⊙X | ⊙X⊙X | ⊙ | ⊙ |
| 4-4 | Al—0.5 at % Ge—5.0 at % Ta—0.2 at % Nd | ⊙X⊙X | ⊙X⊙X | ⊙X⊙X | ⊙X⊙X | ⊙ | ⊙ |
| 4-5 | Al—0.5 at % Ge—0.1 at % Ti—0.2 at % Nd | ⊙X⊙X | ⊙X⊙X | ○X○○x | ○X○○X | ⊙ | ⊙ |
| 4-6 | Al—0.5 at % Ge—0.5 at % Ti—0.2 at % Nd | ⊙X⊙X | ⊙X⊙X | ⊙X⊙X | ⊙X⊙X | ⊙ | ⊙ |
| 4-7 | Al—0.5 at % Ge—1.0 at % Ti—0.2 at % Nd | ⊙X⊙X | ⊙X⊙X | ⊙X⊙X | ⊙X⊙X | ⊙ | ⊙ |
| 4-8 | Al—0.5 at % Ge—5.0 at % Ti—0.2 at % Nd | ⊙X⊙X | ⊙X⊙X | ⊙X⊙X | ⊙X⊙X | ⊙ | ⊙ |
| 4-9 | Al—0.5 at % Ge—0.1 at % Zr—0.2 at % Nd | ⊙X⊙X | ⊙X⊙X | ○X○○X | ○X○○X | ⊙ | ⊙ |
| 4-10 | Al—0.5 at % Ge—0.5 at % Zr—0.2 at % Nd | ⊙X⊙X | ⊙X⊙X | ⊙X⊙X | ⊙X⊙X | ⊙ | ⊙ |
| 4-11 | Al—0.5 at % Ge—1.0 at % Zr—0.2 at % Nd | ⊙X⊙X | ⊙X⊙X | ⊙X⊙X | ⊙X⊙X | ⊙ | ⊙ |
| 4-12 | Al—0.5 at % Ge—5.0 at % Zr—0.2 at % Nd | ⊙X⊙X | ⊙X⊙X | ⊙X⊙X | ⊙X⊙X | ⊙ | ⊙ |
| 4-13 | Al—0.5 at % Ge—0.1 at % Hf—0.2 at % Nd | ⊙X⊙X | ⊙X⊙X | ○X○○X | ○X○○X | ⊙ | ⊙ |
| 4-14 | Al—0.5 at % Ge—0.5 at % Hf—0.2 at % Nd | ⊙X⊙X | ⊙X⊙X | ⊙X⊙X | ⊙X⊙X | ⊙ | ⊙ |
| 4-15 | Al—0.5 at % Ge—1.0 at % Hf—0.2 at % Nd | ⊙X⊙X | ⊙X⊙X | ⊙X⊙X | ⊙X⊙X | ⊙ | ⊙ |
| 4-16 | Al—0.5 at % Ge—5.0 at % Hf—0.2 at % Nd | ⊙X⊙X | ⊙X⊙X | ⊙X⊙X | ⊙X⊙X | ⊙ | ⊙ |
| 4-17 | Al—0.5 at % Ge—0.5 at % W  0.2 at % Nd | ⊙X⊙X | ⊙X⊙X | ⊙X⊙X | ⊙X⊙X | ⊙ | ⊙ |
| 4-18 | Al—0.5 at % Ge—0.5 at % Cr—0.2 at % Nd | ⊙X⊙X | ⊙X⊙X | ⊙X⊙X | ⊙X⊙X | ⊙ | ⊙ |
| 4-19 | Al—0.5 at % Ge—0.5 at % Nb—0.2 at % Nd | ⊙X⊙X | ⊙X⊙X | ⊙X⊙X | ⊙X⊙X | ⊙ | ⊙ |
| 4-20 | Al—0.5 at % Ge—0.5 at % Mo—0.2 at % Nd | ⊙X⊙X | ⊙X⊙X | ⊙X⊙X | ⊙X⊙X | ⊙ | ⊙ |
| 4-21 | Al—0.5 at % Ge—0.5 at % Ir—0.2 at % Nd | ⊙X⊙X | ⊙X⊙X | ⊙X⊙X | ⊙X⊙X | ⊙ | ⊙ |
| 4-22 | Al—0.5 at % Ge—0.5 at % Pt—0.2 at % Nd | ⊙X⊙X | ⊙X⊙X | ⊙X⊙X | ⊙X⊙X | ⊙ | ⊙ |
| 4-23 | Al—0.5 at % Ge—0.5 at % Re—0.2 at % Nd | ⊙X⊙X | ⊙X⊙X | ⊙X⊙X | ⊙X⊙X | ⊙ | ⊙ |
| 4-24 | Al—0.5 at % Ge—0.5 at % Os—0.2 at % Nd | ⊙X⊙X | ⊙X⊙X | ⊙X⊙X | ⊙X⊙X | ⊙ | ⊙ |

| No. | (1) Heat resistance 550° C. | (1) Heat resistance 600° C. | (2) Dry-etching property | (3) Wiring resistance 450° C. | (3) Wiring resistance 550° C. | (3) Wiring resistance 600° C. | (4) Contact resistance with ITO 600° C. | (5) Resistance to stripping solution 600° C. | (6) Resistance to alkaline developer |
|---|---|---|---|---|---|---|---|---|---|
| 4-1 | ○ | ○ | ⊙ | ⊙ | ⊙ | ⊙ | X | ⊙ | ⊙ |
| 4-2 | ⊙ | ○ | ⊙ | ⊙ | ⊙ | ⊙ | X | ⊙ | ⊙ |
| 4-3 | ⊙ | ○ | ⊙ | ⊙ | ⊙ | ⊙ | X | ⊙ | ⊙ |
| 4-4 | ⊙ | ○ | ○ | ○ | ○ | ○ | X | ⊙ | ⊙ |
| 4-5 | ○ | ○ | ⊙ | ⊙ | ⊙ | ⊙ | X | ⊙ | ⊙ |
| 4-6 | ⊙ | ○ | ⊙ | ⊙ | ⊙ | ⊙ | X | ⊙ | ⊙ |
| 4-7 | ⊙ | ○ | ⊙ | ⊙ | ⊙ | ⊙ | X | ⊙ | ⊙ |
| 4-8 | ⊙ | ○ | ○ | ○ | ○ | ○ | X | ⊙ | ⊙ |
| 4-9 | ○ | ○ | ⊙ | ⊙ | ⊙ | ⊙ | X | ⊙ | ⊙ |
| 4-10 | ⊙ | ○ | ⊙ | ⊙ | ⊙ | ⊙ | X | ⊙ | ⊙ |
| 4-11 | ⊙ | ○ | ⊙ | ⊙ | ⊙ | ⊙ | X | ⊙ | ⊙ |
| 4-12 | ⊙ | ○ | ○ | ○ | ○ | ○ | X | ⊙ | ⊙ |
| 4-13 | ○ | ○ | ⊙ | ⊙ | ⊙ | ⊙ | X | ⊙ | ⊙ |
| 4-14 | ⊙ | ○ | ⊙ | ⊙ | ⊙ | ⊙ | X | ⊙ | ⊙ |
| 4-15 | ⊙ | ○ | ⊙ | ⊙ | ⊙ | ⊙ | X | ⊙ | ⊙ |
| 4-16 | ⊙ | ○ | ○ | ○ | ○ | ○ | X | ⊙ | ⊙ |
| 4-17 | ⊙ | ○ | ⊙ | ⊙ | ⊙ | ⊙ | X | ⊙ | ⊙ |
| 4-18 | ⊙ | ○ | ⊙ | ⊙ | ⊙ | ⊙ | X | ⊙ | ⊙ |
| 4-19 | ⊙ | ○ | ⊙ | ⊙ | ⊙ | ⊙ | X | ⊙ | ⊙ |
| 4-20 | ⊙ | ○ | ⊙ | ⊙ | ⊙ | ⊙ | X | ⊙ | ⊙ |
| 4-21 | ⊙ | ○ | ⊙ | ⊙ | ⊙ | ⊙ | X | ⊙ | ⊙ |
| 4-22 | ⊙ | ○ | ⊙ | ⊙ | ⊙ | ⊙ | X | ⊙ | ⊙ |
| 4-23 | ⊙ | ○ | ⊙ | ⊙ | ⊙ | ⊙ | X | ⊙ | ⊙ |
| 4-24 | ⊙ | ○ | ⊙ | ⊙ | ⊙ | ⊙ | X | ⊙ | ⊙ |

TABLE 5

| No. | Composition of Al alloy film (balance: Al and incidental impurities) | Precipitate size 550° C. | Precipitate size 600° C. | Precipitate density 550° C. | Precipitate density 600° C. | (1) Heat resistance 350° C. | (1) Heat resistance 450° C. |
|---|---|---|---|---|---|---|---|
| 5-1 | Al—0.5 at % Ge—0.5 at % Ta | ⊙XXXX | ⊙XXXX | ⊙XXXX | ⊙XXXX | ⊙ | ⊙ |
| 5-2 | Al—0.5 at % Ge—0.5 at % Zr | ⊙XXXX | ⊙XXXX | ⊙XXXX | ⊙XXXX | ⊙ | ⊙ |
| 5-3 | Al—0.5 at % Ge—0.5 at % Hf | ⊙XXXX | ⊙XXXX | ⊙XXXX | ⊙XXXX | ⊙ | ⊙ |

TABLE 5-continued

| | | | | | | | |
|---|---|---|---|---|---|---|---|
| 5-4 | Al—0.5 at % Ge—0.5 at % Ta—0.5 at % Zr | ⊙⊙XXX | ⊙⊙XXX | ⊙⊙XXX | ⊙⊙XXX | ⊙ | ⊙ |
| 5-5 | Al—0.5 at % Ge—0.5 at % Ta—0.5 at % Hf | ⊙⊙XXX | ⊙⊙XXX | ⊙⊙XXX | ⊙⊙XXX | ⊙ | ⊙ |

| | (1) Heat resistance | | (2) Dry-etching property | (3) Wiring resistance | | | (4) Contact resistance with ITO | (5) Resistance to stripping solution | (6) Resistance to alkaline developer |
|---|---|---|---|---|---|---|---|---|---|
| No. | 550° C. | 600° C. | — | 450° C. | 550° C. | 600° C. | 600° C. | 600° C. | — |
| 5-1 | ○ | ○ | ⊙ | ⊙ | ⊙ | ⊙ | X | ⊙ | ○ |
| 5-2 | ○ | ○ | ⊙ | ⊙ | ⊙ | ⊙ | X | ⊙ | ○ |
| 5-3 | ○ | ○ | ⊙ | ⊙ | ⊙ | ⊙ | X | ⊙ | ○ |
| 5-4 | ○ | ○ | ⊙ | ⊙ | ⊙ | ⊙ | X | ⊙ | ○ |
| 5-5 | ○ | ○ | ⊙ | ⊙ | ⊙ | ⊙ | X | ⊙ | ○ |

TABLE 6

| | Composition of Al alloy film | Precipitate size | | Precipitate density | | (1) Heat resistance | |
|---|---|---|---|---|---|---|---|
| No. | (balance: Al and incidental impurities) | 550° C. | 600° C. | 550° C. | 600° C. | 350° C. | 450° C. |
| 6-1 | Al | XXXXX | XXXXX | XXXXX | XXXXX | X | X |
| 6-2 | Al—0.5 at % Ge | XXXXX | XXXXX | XXXXX | XXXXX | X | X |
| 6-3 | Al—0.5 at % Ta | XXXXX | XXXXX | XXXXX | XXXXX | ⊙ | X |
| 6-4 | Al—0.5 at % Ge—0.5 at % Ta—0.5 at % Zr—1.0 at % Nd—0.1 at % Ni | ⊙⊙⊙⊙⊙ | ⊙⊙⊙⊙⊙ | ⊙⊙⊙⊙⊙ | ⊙⊙⊙⊙⊙ | ⊙ | ⊙ |
| 6-5 | Al—0.5 at % Ge—0.5 at % Ta—0.5 at % Zr—0.2 at % Nd—1.0 at % Ni | ⊙⊙⊙⊙⊙ | ⊙⊙⊙⊙⊙ | ⊙⊙⊙⊙⊙ | ⊙⊙⊙⊙⊙ | ⊙ | ⊙ |
| 6-6 | Al—4.0 at % Ge—0.5 at % Ta—0.5 at % Zr—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ | ⊙ | ⊙ |
| 6-7 | Al—0.5 at % Ge—5.0 at % Ta—5.0 at % Zr—0.2 at % Nd—0.1 at % Ni | ⊙⊙⊙⊙⊙ | ⊙⊙⊙⊙⊙ | ⊙⊙⊙⊙⊙ | ⊙⊙⊙⊙⊙ | ⊙ | ⊙ |

| | (1) Heat resistance | | (2) Dry-etching property | (3) Wiring resistance | | | (4) Contact resistance with ITO | (5) Resistance to stripping solution | (6) Resistance to alkaline developer |
|---|---|---|---|---|---|---|---|---|---|
| No. | 550° C. | 600° C. | — | 450° C. | 550° C. | 600° C. | 600° C. | 600° C. | — |
| 6-1 | X | X | ⊙ | ⊙ | ⊙ | ○ | X | ⊙ | ⊙ |
| 6-2 | X | X | ⊙ | ⊙ | ⊙ | ○ | X | ⊙ | ⊙ |
| 6-3 | X | X | ⊙ | ⊙ | ⊙ | ○ | X | ⊙ | ○ |
| 6-4 | ⊙ | ⊙ | X | ⊙ | ⊙ | ⊙ | ○ | ⊙ | ⊙ |
| 6-5 | ⊙ | ⊙ | X | ⊙ | ⊙ | ⊙ | ○ | ⊙ | Δ |
| 6-6 | ⊙ | ⊙ | Δ | ○ | ⊙ | ⊙ | ○ | ⊙ | ○ |
| 6-7 | ⊙ | ⊙ | Δ | ○ | ⊙ | ⊙ | ○ | ⊙ | ○ |

TABLE 7

| Item | | ⊙ | ○ | Δ | X |
|---|---|---|---|---|---|
| Precipitate size (diameter, nm) | First precipitate | 50 nm to 800 nm | more than 800 nm and 1 μm or less | more than 1 μm | no precipitate or less than 50 nm |
| | Second precipitate | 50 nm to 800 nm | more than 800 nm and 1 μm or less | more than 1 μm | no precipitate or less than 50 nm |
| | Third precipitate | 10 nm to 800 nm | more than 800 nm and 1 μm or less | more than 1 μm | no precipitate or less than 10 nm |
| | Fourth precipitate | 10 nm to 800 nm | more than 800 nm and 1 μm or less | more than 1 μm | no precipitate or less than 10 nm |
| | Fifth precipitate | 250 nm to 2 μm | more than 2 μm and 3 μm or less | more than 3 μm | no precipitate or less than 250 nm |
| Precipitate density (particles/mm$^2$)* | First precipitate | 2,000,000 or more | 200,000 or more and less than 2,000,000 | 100,000 or more and less than 2,000,000 | less than 100,000 |
| | Second precipitate | 1,000,000 or more | 100,000 or more and less than 1,000,000 | 50,000 or more and less than 1,000,000 | less than 5,000 |
| | Third precipitate | 3,000,000 or more | 1,000,000 or more and less than 3,000,000 | 300,000 or more and less than 1,000,000 | less than 300,000 |
| | Fourth precipitate | 3,000,000 or more | 1,000,000 or more and less than 3,000,000 | 300,000 or more and less than 1,000,000 | less than 30,000 |
| | Fifth precipitate | 5,000 or more | 2,000 or more and less than 5,000 | 1,000 or more and less than 2,000 | less than 1,000 |

TABLE 7-continued

| Item | ⊙ | ○ | Δ | X |
|---|---|---|---|---|
| (1) Heat resistance (hillock density, particles/m$^2$) | $1 \times 10^8$ or less | more than $1 \times 10^8$ and $5 \times 10^8$ or less | more than $5 \times 10^8$ and $1 \times 10^9$ or less | $1 \times 10^9$ or more |
| (2) Dry-etching property | No residue and 70% or more of etch rate ratio vs. pure Al | No residue and no residue and 60% or more and less than 70% of etch rate ratio vs. pure Al | no residue and less than 70% of etch rate ratio vs. pure Al | residues formed |
| (3) Wiring resistance (μΩcm)  450° C. | 8 or less | more than 8 and 15 or less | more than 15 and less than 20 | 20 or more |
| 550° C. | 7 or less | more than 7 and 10 or less | more than 10 and less than 12 | 12 or more |
| 600° C. | 5 or less | more than 5 and 8 or less | more than 8 and less than 10 | 10 or more |
| Contact resistance with ITO (Ω/100 μm$^2$) | 100 or less | more than 100 and 200 or less | more than 200 and less than 1,000 | 1,000 or more |
| Resistance to stripping solution (number of corrosion marks, numbers/100 μm$^2$) | 0.1 or less | more than 0.1 and 1 or less | more than 1 and less than 5 | 5 or more |
| Resistance to organic alkaline developer (etch rate, nm/min) | 20 or less | more than 20 and 30 or less | more than 30 and less than 40 | 40 or more |

Now results described in Tables 1 to 5 are discussed. In each of these tables, starting from the left, the size and the density of the first to fifth precipitates are indicated; "⊙x⊙⊙⊙" in the columns of "Precipitate size (550° C./600° C.)" and "Precipitate density (550° C./600° C.)" represent that the size and density of each of the first and the third to fifth precipitates satisfy the corresponding requirement represented by "⊙" while both size and density of the second precipitates do not fulfill the respective requirement represented by "x".

Each of the Al alloy films of Nos. 1-1 to 1-32 described in Table 1 corresponds to the third Al alloy film according to the present invention and satisfies the alloy composition specified in the present invention and the requirements (size and density) of the first to fifth precipitates, thereby resulting in excellent heat resistance not only at a low temperature (350° C.) but also at a high temperature of 450° C. to 600° C. Their dry-etching property is also satisfactory. With respect to the electrical resistance after the high-temperature heat treatment, each Al alloy film has a lower electrical resistance than a refractory metal. Each Al alloy film has satisfactory resistances to the alkaline developer before the high-temperature heat treatment and the stripping solution after the high-temperature heat treatment, respectively. Furthermore, the direct contact resistance between the Al alloy film and ITO (transparent pixel electrode) is greatly reduced.

Next, each of the Al alloy films of Nos. 2-1 to 2-24 in Table 2 corresponds to the third Al alloy film according to the present invention and satisfies the alloy composition specified in the present invention and the requirements (size and density) of the first and third to fifth precipitates, thereby resulting in excellent heat resistance not only at a low temperature (350° C.) but also at a high temperature of 450° C. to 600° C. Their dry-etching property is also satisfactory. With respect to the electrical resistance after the high-temperature heat treatment, each Al alloy film has a lower electrical resistance than a refractory metal. Each Al alloy film has satisfactory resistances to the alkaline developer before the high-temperature heat treatment and the stripping solution after the high-temperature heat treatment, respectively. Furthermore, the direct contact resistance between the Al alloy film and ITO (transparent pixel electrode) is greatly reduced.

Next, each of the Al alloy films of Nos. 3-1 to 3-30 in Table 3 corresponds to the second Al alloy film according to the present invention and satisfies the alloy composition specified in the present invention and the requirements (size and density) of the first to fourth precipitates, thereby resulting in excellent heat resistance not only at a low temperature (350° C.) but also at a high temperature of 450° C. to 600° C. Their dry-etching property is also satisfactory. With respect to the electrical resistance after the high-temperature heat treatment, each Al alloy film has a lower electrical resistance than a refractory metal. Each Al alloy film has satisfactory resistances to the alkaline developer and the stripping solution. With respect to the direct contact resistance between the Al alloy film and ITO (transparent pixel electrode) is high due to the absence of any of Ni, Co, or Fe. The direct contact with ITO is not achieved.

Next, each of the Al alloy films of Nos. 4-1 to 3-24 in Table 4 corresponds to the second Al alloy film according to the present invention and satisfies the alloy composition specified in the present invention and the requirements (size and density) of the first, third, and fourth precipitates, thereby resulting in excellent heat resistance not only at a low temperature (350° C.) but also at a high temperature of 450° C. to 600° C. Their dry-etching property is also satisfactory. With respect to the electrical resistance after the high-temperature heat treatment, each Al alloy film has a lower electrical resistance than a refractory metal. Each Al alloy film has satisfactory resistances to the alkaline developer and the stripping solution. With respect to the direct contact resistance between the Al alloy film and ITO (transparent pixel electrode) is high due to the absence of any of Ni, Co, or Fe.

Next, each of the Al alloy films of Nos. 5-1 to 5-3 in Table 5 corresponds to the first Al alloy film according to the present invention and satisfies the alloy composition specified in the present invention and the requirements (size and density) of the first precipitate, thereby resulting in excellent heat resistance not only at a low temperature (350° C.) but also at a high temperature of 450° C. to 600° C. The dry-etching property is also satisfactory. With respect to the electrical resistance after the high-temperature heat treatment, each Al alloy film has a lower electrical resistance than a refractory metal. Each Al alloy film has satisfactory resistances to the alkaline developer and the stripping solution. With respect to the direct contact resistance between the Al alloy film and ITO (transparent pixel electrode) is high due to the absence of any of Ni, Co, or Fe.

Next, each of the Al alloy films of Nos. 5-4 to 5-5 in Table 5 corresponds to the first Al alloy film according to the present invention and satisfies the alloy composition specified in the present invention and the requirements (size and density) of the first and second precipitates, thereby resulting in excellent heat resistance not only at a low temperature (350° C.) but also at a high temperature of 450° C. to 600° C. The dry-etching property is also satisfactory. With respect to the electrical resistance after the high-temperature heat treatment, each Al alloy film has a lower electrical resistance than a refractory metal. Each Al alloy film has satisfactory resistances to the alkaline developer and the stripping solution. With respect to the direct contact resistance between the Al alloy film and ITO (transparent pixel electrode) is high due to the absence of any of Ni, Co, or Fe.

In contrast, each of the Al alloy films of Nos. 6-1 to 6-7 in Table 6 is example which does not satisfy the requirements of the first to third Al alloy films according to the present invention. The Al alloy films of Nos. 6-1 to 6-3 are examples which do not satisfy the alloy composition and the requirements of the precipitates. Their wiring resistance is comparatively satisfactory. This is because their surface condition became coarse due to poor heat resistance of the wiring. The Al alloy films of Nos. 6-4 to 6-7 do not satisfy the alloy composition and showed poor dry-etching property.

While the present invention has been described in detail above with references to specific embodiments thereof, it will be apparent to one with skill in the art that various changes and modifications may be made without departing from the spirit and scope of the present invention.

This application claims the benefit of Japanese Patent Application No. 2011-42635 filed Feb. 28, 2011, which are hereby incorporated by reference herein in their entirety.

INDUSTRIAL APPLICABILITY

A first Al alloy film (Al—Ge-group X element) according to the present invention is composed of predetermined alloy elements and a first precipitate (preferably a first and a second precipitates). Thus, the first Al alloy film has excellent heat resistance when exposed to a high temperature of about 450° C. to about 600° C., and has satisfactory low electrical resistance (wiring resistance) after high-temperature treatment, and also corrosion resistance, etching property, and resistance to alkaline corrosion.

A second Al alloy film (Al—Ge-group X element-rare-earth element alloy) according to the present invention, a preferred embodiment, is composed of predetermined alloy elements and a first precipitate (preferably a first and a second precipitates) and a third precipitate (preferably a third and fourth precipitates). Thus, the first Al alloy film has higher heat resistance and has even better resistance to alkaline corrosion. More preferably, a third Al alloy film (Al—Ge-group X element-[Ni,Co,Fe] alloy, preferably Al—Ge-group X element-rare earth element-[Ni,Co,Fe] alloy) according to the present invention is composed of predetermined alloy elements, the first precipitate (preferably the first and the second precipitates, and more preferably the first, second, and third precipitates, and even more preferably the first, second, third, and fourth precipitates), and the fifth precipitate. Thus, low contact resistance with a transparent conductive film can be provided in addition to the foregoing properties. It is therefore possible to directly connect the Al alloy film to the transparent conductive film.

According to the present invention, in particular, in a process for producing a thin-film transistor substrate including semiconductor layers composed of polycrystalline silicon and continuous grain silicon, when the substrate is exposed to a harsh high-temperature environment in which high-temperature heat treatment at about 450° C. to about 600° C. is performed and even when the high-temperature heat treatment is performed at least twice, carrier mobilities in the semiconductor silicon layers are increased, thereby improving the response speed of a TFT. It is thus possible to provide a high-performance display device that can achieve power savings and support high-speed moving images. Moreover, both wet-etching method and dry-etching method are applicable in wiring fabrication.

According to the present invention, in a process for producing a semiconductor device such as IGBT having an electrode/wiring comprising the Al alloy film superior in heat resistance (particularly high-temperature heat resistance), high-temperature heat treatment can be performed to activate carriers in a collector layer. It is thus possible to provide an improved semiconductor device having the Al alloy film and an improved semiconductor apparatus having the semiconductor device. The present invention also provides applicability both dry-etching and wet-etching processes to wiring fabrication.

DESCRIPTION OF REFERENCE NUMERALS AND SIGNS

1 chamber
2 dielectric window
3 antenna
4 high-frequency power (antenna side)
5 matching box (antenna side)
6 process gas inlet
7 substrate (to-be-etched material)
8 suceptor
9 dielectric chuck
10 collar
11 matching box (substrate side)
12 high-frequency power (substrate side)
21*a* glass substrate
25 scan line
26 gate electrode
27 gate insulating film
28 source electrode
29 drain electrode
30 semiconductor silicon layer
31 passivation film
32 low-resistance silicon layer
33 insulating passivation film
35 transparent electrode

The invention claimed is:
1. An Al alloy film, comprising:
0.01 to 2.0 at % Ge;
at least one element X selected from the group consisting of Ta, Ti, Zr, Hf, W, Cr, Nb, Mo, Ir, Pt, Re, and Os; and
at least one rare earth element;
wherein:
first precipitates comprising Al, Ge, and the at least one element X are present in the Al alloy film;
each of the first precipitates has an equivalent circle diameter of 50 nm or more; and
the first precipitates are present at a density of 200,000 particles/mm$^2$ or more in the Al alloy film;
third precipitates comprising Al, the at least one element X, and the at least one rare earth element are present in the Al alloy film;
each of the third precipitates has an equivalent circle diameter of 10 nm or more; and
the third precipitates are present at a density of 1,000,000 particles/mm$^2$ or more in the Al alloy film.
2. The Al alloy film of claim 1, wherein each of the first precipitates has an equivalent circle diameter of 1 μm or less.

3. The Al alloy film of claim 1, wherein the at least one element X is present in the Al alloy film in an amount of 0.1 to 5 at %.

4. The Al alloy film of claim 1, wherein:
the Al alloy film comprises at least two elements X;
second precipitates comprising Al and the at least two elements X are present in the Al alloy film;
each of the second precipitates has an equivalent circle diameter of 50 nm or more; and
the second precipitates are present at a density of 100,000 particles/mm$^2$ or more in the Al alloy film.

5. The Al alloy film of claim 4, wherein each of the second precipitates has an equivalent circle diameter of 1 μm or less.

6. The Al alloy film of claim 1, wherein each of the third precipitates has an equivalent circle diameter of 1 μm or less.

7. The Al alloy film of claim 1, wherein the at least one rare earth element is present in the Al alloy film in an amount of 0.1 to 0.45 at %.

8. The Al alloy film of claim 1, wherein:
fourth precipitates comprising Al, Ge, the at least one element X, and the at least one rare earth element are present in the Al alloy film;
each of the fourth precipitates has an equivalent circle diameter of 10 nm or more; and
the fourth precipitates are present at a density of 1,000,000 particles/mm$^2$ or more in the Al alloy film.

9. The Al alloy film of claim 8, wherein each of the fourth precipitates has an equivalent circle diameter of 1 μm or less.

10. The Al alloy film of claim 1, wherein:
the Al alloy film comprises at least one element selected from the group consisting of Ni, Co, and Fe;
fifth precipitates comprising Al, Ge, the at east one element X, and the at least one element selected from the group consisting of Ni, Co, and Fe are present in the Al alloy film;
each of the fifth precipitates has an equivalent circle diameter of 250 nm or more; and
the fifth precipitates are present at a density of 2,000 particles/mm$^2$ or more in the Al alloy film.

11. The Al alloy film of claim 10, wherein each of the fifth precipitates has an equivalent circle diameter of 3 μm or less.

12. The Al alloy film of claim 10, wherein the at least one element selected from the group consisting of Ni, Co, and Fe is present in the Al alloy film in an amount of 0.1 to 0.35 at %.

* * * * *